United States Patent
Pong

(10) Patent No.: US 7,698,523 B2
(45) Date of Patent: Apr. 13, 2010

(54) HARDWARE MEMORY LOCKS

(75) Inventor: Fong Pong, Mountain View, CA (US)

(73) Assignee: Broadcom Corporation, Irvine, CA (US)

( * ) Notice: Subject to any disclaimer, the term of this patent is extended or adjusted under 35 U.S.C. 154(b) by 421 days.

(21) Appl. No.: 11/529,624

(22) Filed: Sep. 29, 2006

(65) Prior Publication Data

US 2008/0082771 A1    Apr. 3, 2008

(51) Int. Cl.
G06F 12/00    (2006.01)

(52) U.S. Cl. .................................................. 711/163

(58) Field of Classification Search ................ None
See application file for complete search history.

(56) References Cited

U.S. PATENT DOCUMENTS

| | | | |
|---|---|---|---|
| 5,749,095 A * | 5/1998 | Hagersten ............... 711/141 |
| 5,878,268 A | 3/1999 | Hagersten |
| 6,085,295 A | 7/2000 | Ekanadham et al. |
| 6,226,718 B1 * | 5/2001 | Carpenter et al. ........... 711/152 |
| 6,275,907 B1 | 8/2001 | Baumgartner et al. |
| 6,640,289 B2 | 10/2003 | McCrory et al. |
| 6,886,079 B2 | 4/2005 | Arimilli et al. |
| 6,976,108 B2 | 12/2005 | Kim et al. |
| 7,177,987 B2 | 2/2007 | Van Doren et al. |
| 2002/0007439 A1 | 1/2002 | Gharachorloo et al. |
| 2002/0049608 A1 | 4/2002 | Hartsell et al. |
| 2002/0049841 A1 | 4/2002 | Johnson et al. |
| 2002/0059274 A1 | 5/2002 | Hartsell et al. |
| 2002/0065864 A1 | 5/2002 | Hartsell et al. |
| 2002/0095400 A1 | 7/2002 | Johnson et al. |
| 2002/0120741 A1 | 8/2002 | Webb et al. |
| 2002/0152305 A1 | 10/2002 | Jackson et al. |
| 2002/0174227 A1 | 11/2002 | Hartsell et al. |
| 2002/0194251 A1 | 12/2002 | Richter et al. |
| 2003/0009643 A1 * | 1/2003 | Arimilli et al. .............. 711/155 |
| 2003/0046396 A1 | 3/2003 | Richter et al. |
| 2003/0236745 A1 | 12/2003 | Hartsell et al. |
| 2004/0193936 A1 * | 9/2004 | Kelly .......................... 713/500 |
| 2006/0021035 A1 | 1/2006 | Conti et al. |
| 2006/0059315 A1 | 3/2006 | Moll |
| 2006/0218556 A1 * | 9/2006 | Nemirovsky et al. ........ 718/104 |
| 2007/0271461 A1 | 11/2007 | Hardy et al. |
| 2008/0082622 A1 | 4/2008 | Pong |

(Continued)

OTHER PUBLICATIONS

Extended European Search Report for Patent Application No. EP 07 00 4381 completed Jan. 31, 2008, 3 pgs.

(Continued)

*Primary Examiner*—Hiep T Nguyen
(74) *Attorney, Agent, or Firm*—Sterne, Kessler, Goldstein & Fox P.L.L.C.

(57) ABSTRACT

Methods, systems and computer program products to implement hardware memory locks are described herein. A system to implement hardware memory locks is provided. The system comprises an off-chip memory coupled to a System-On-a-Chip(SOC) unit that includes a controller and an on-chip memory. Upon receiving a request from a requester to access a first memory location in the off-chip memory, the controller is enabled to grant access to modify the first memory location based on an entry stored in a second memory location of the on-chip memory. In an embodiment, the on-chip memory is Static Random Access Memory (SRAM) and the off-chip memory is Random Access Memory (RAM).

20 Claims, 27 Drawing Sheets

U.S. PATENT DOCUMENTS

2008/0082758 A1 4/2008 Pong
2008/0082759 A1 4/2008 Pong

OTHER PUBLICATIONS

Gupta et al, "Reducing Memory and Traffic Requirements for Scalable Directory-Based Cache Coherence Schemes" PICPP XX, Aug. 13, 1990, pp. I312-I321, XP002086278.

Non-Final Action mailed Dec. 22, 2008 for U.S. Appl. No. 11/529,356, filed Sep. 29, 2006, 7 pgs.
Requirement for Restriction/Election mailed Feb. 2, 2009 for U.S. Appl. No. 11/529,357, filed Sep. 29, 2006, 8 pgs.
Non-Final Action mailed Jan. 6, 2009 for U.S. Appl. No. 11/529,623, filed Sep. 29, 2006, 7 pgs.
Non-Final Office Action mailed Sep. 2, 2009 for Appl. No. 11/529,357, (12 pgs.).

* cited by examiner

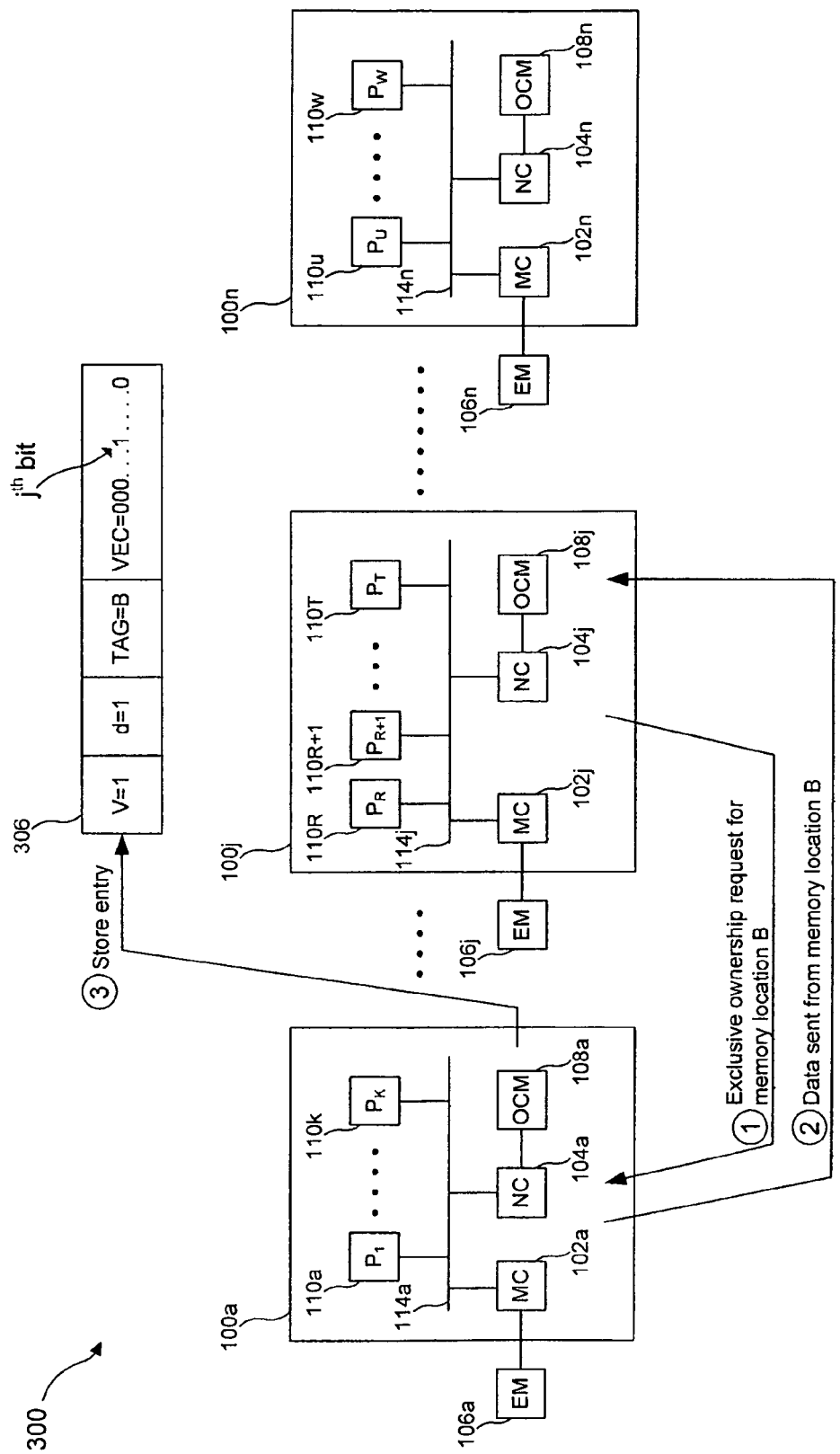
FIG. 3C1

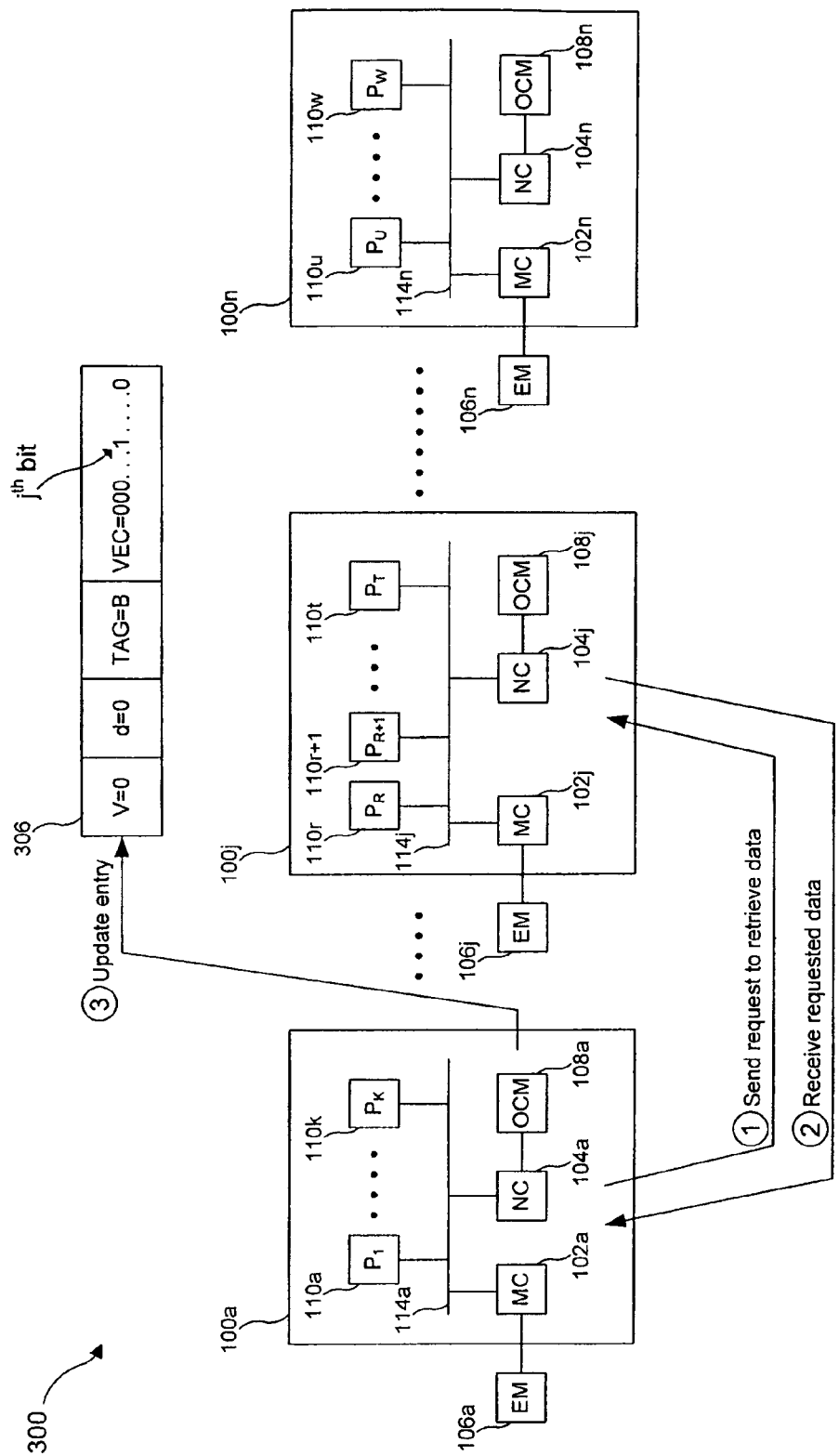
FIG. 3C2

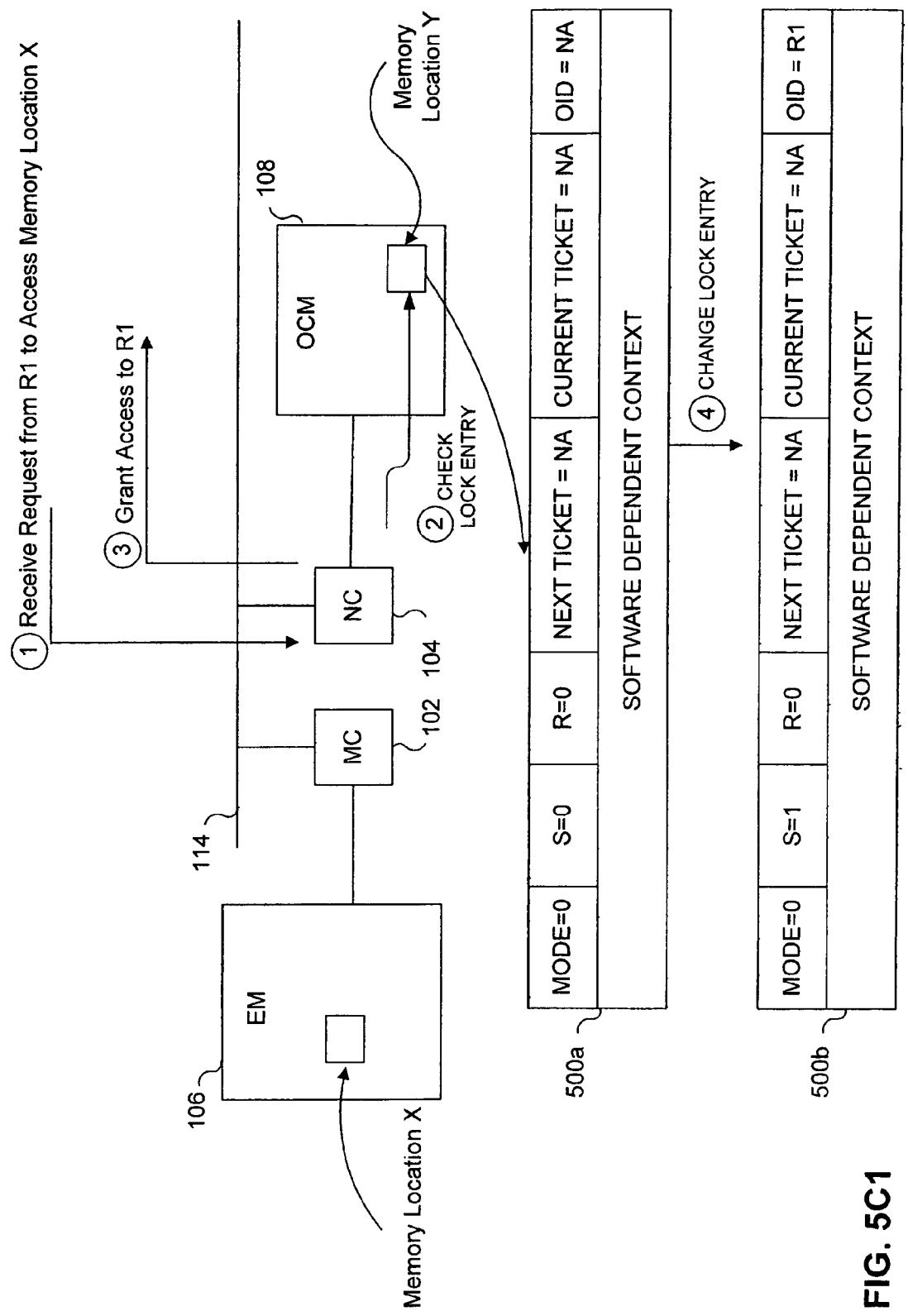
FIG. 5C1

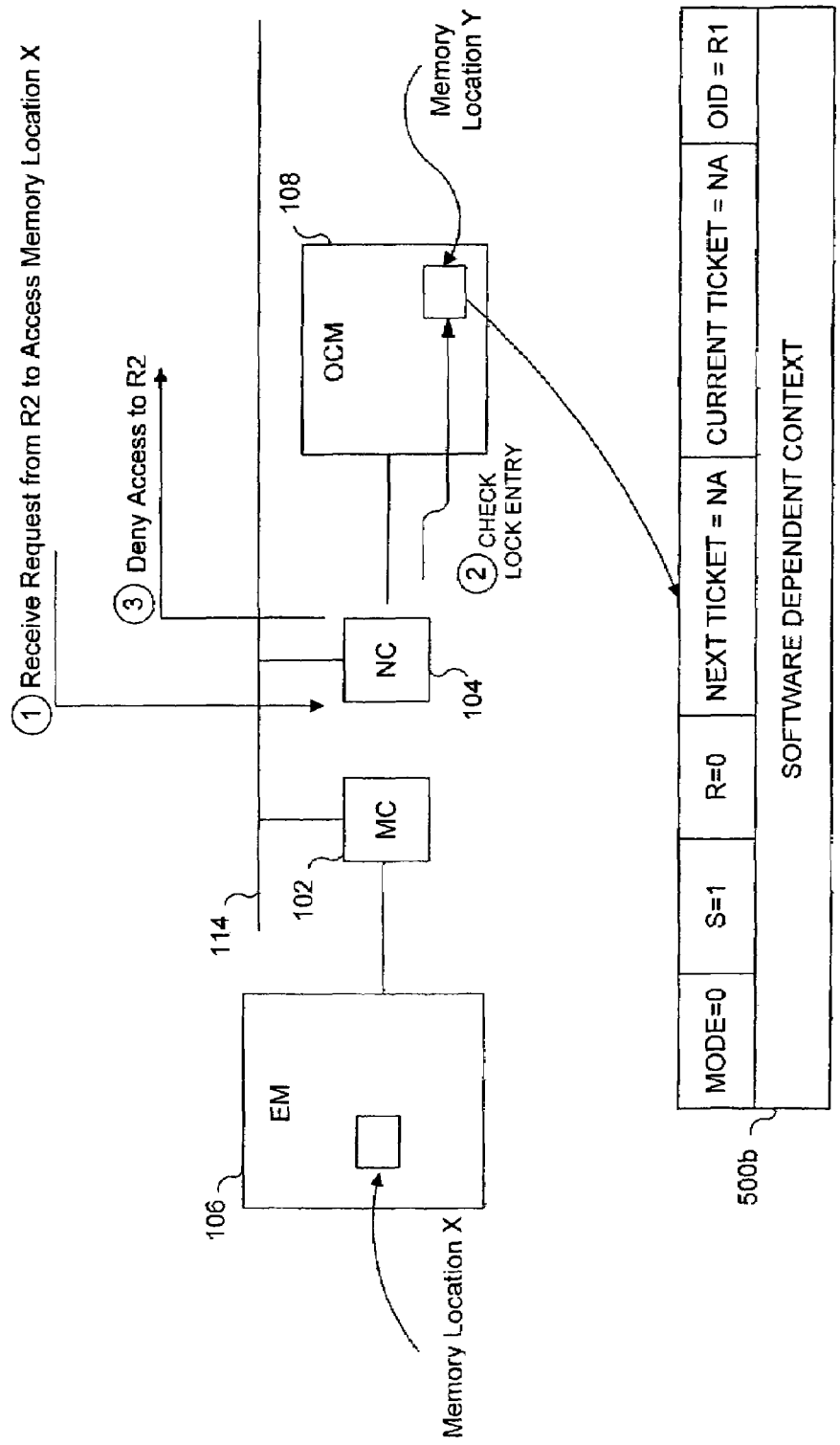
FIG. 5C2

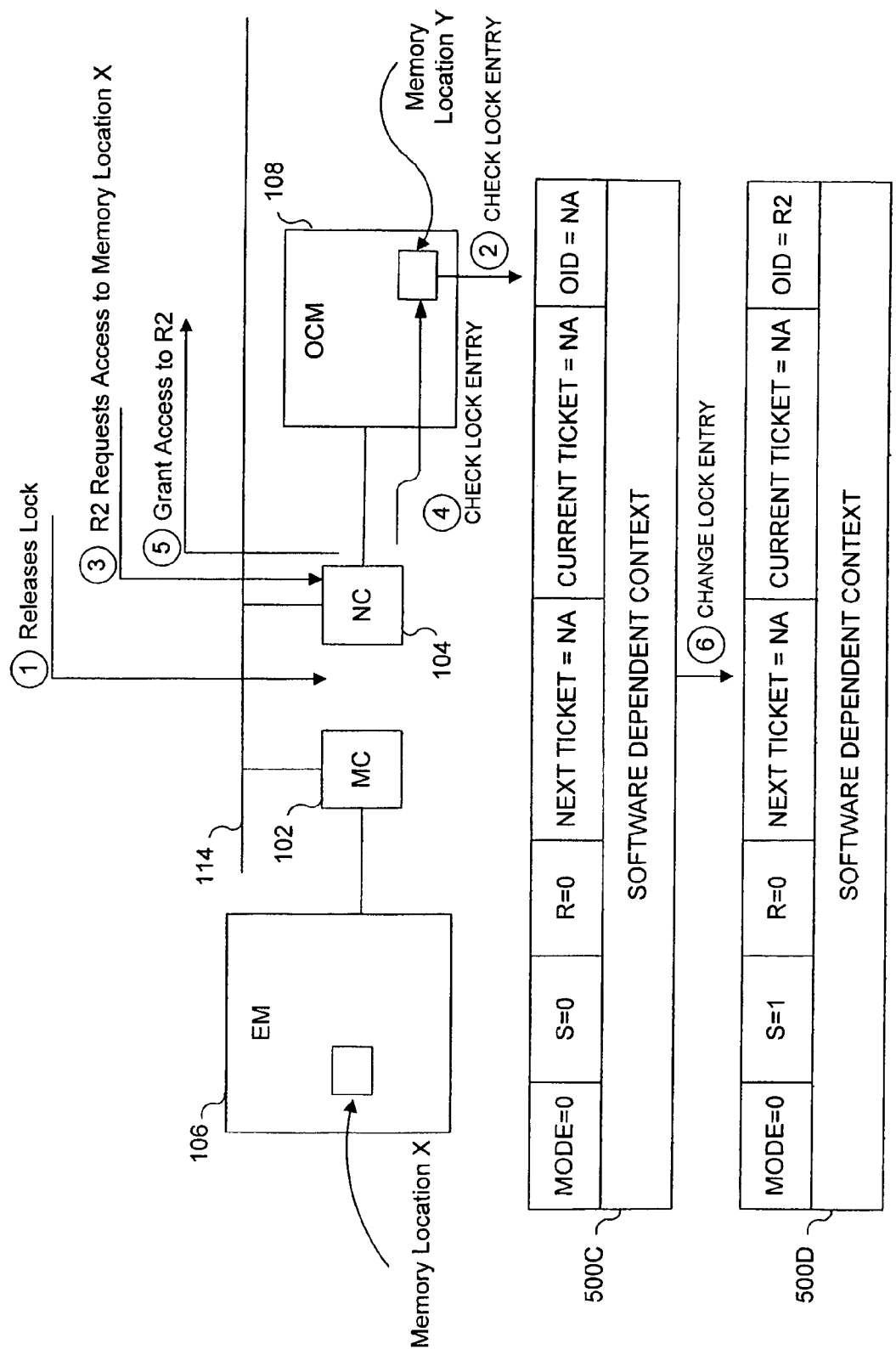
FIG. 5C3

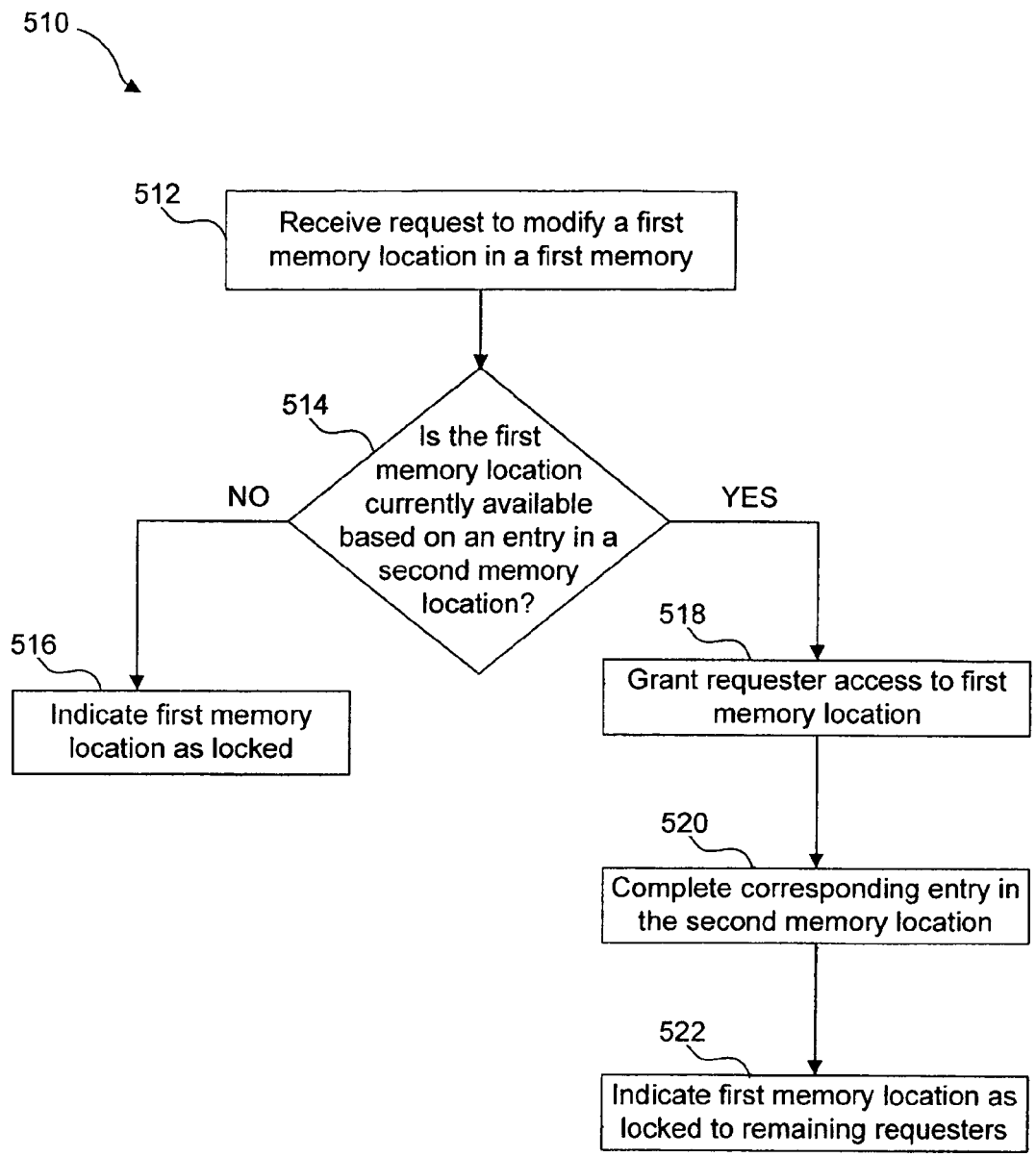
FIG. 5C4

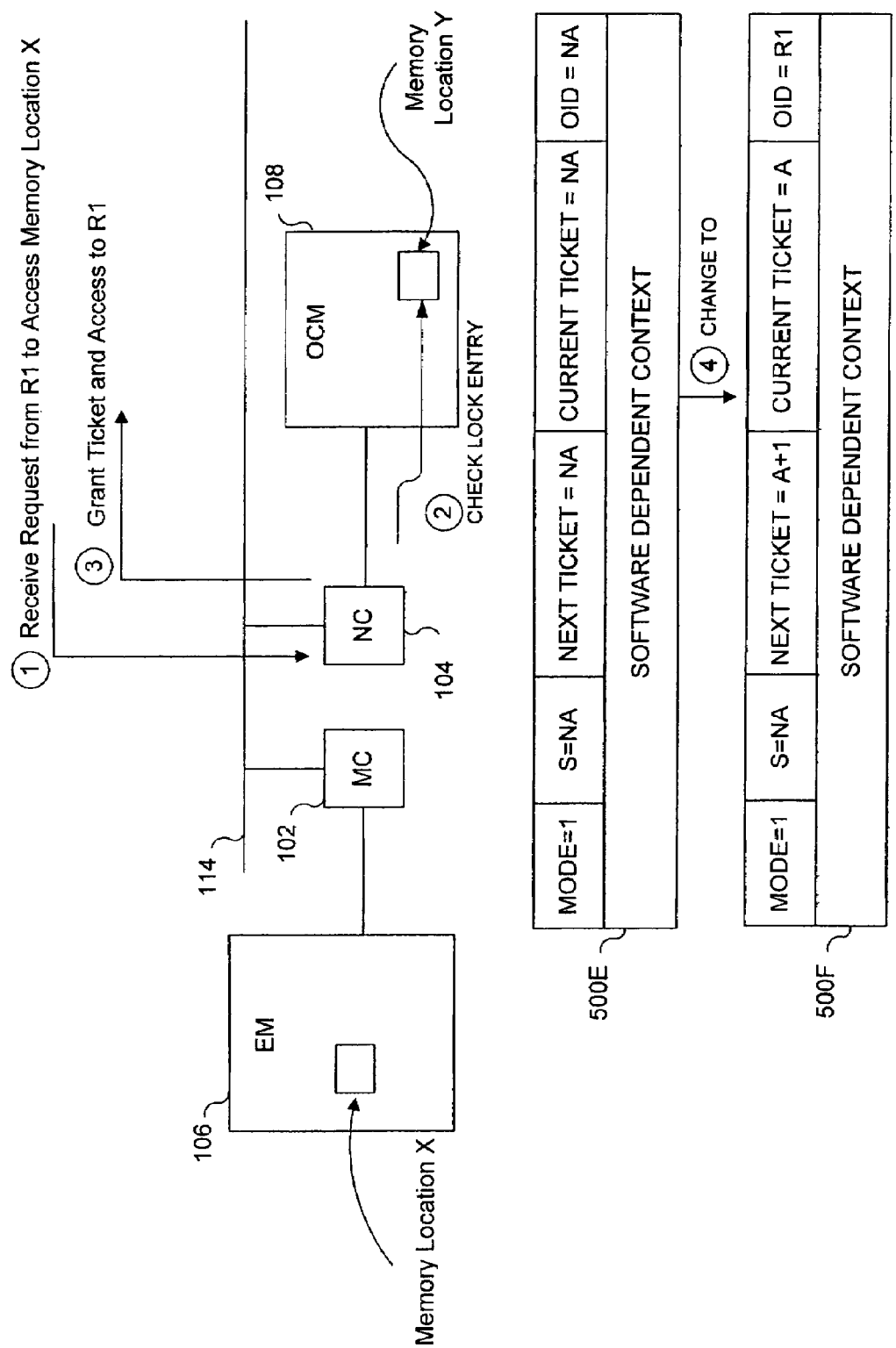
FIG. 5D1

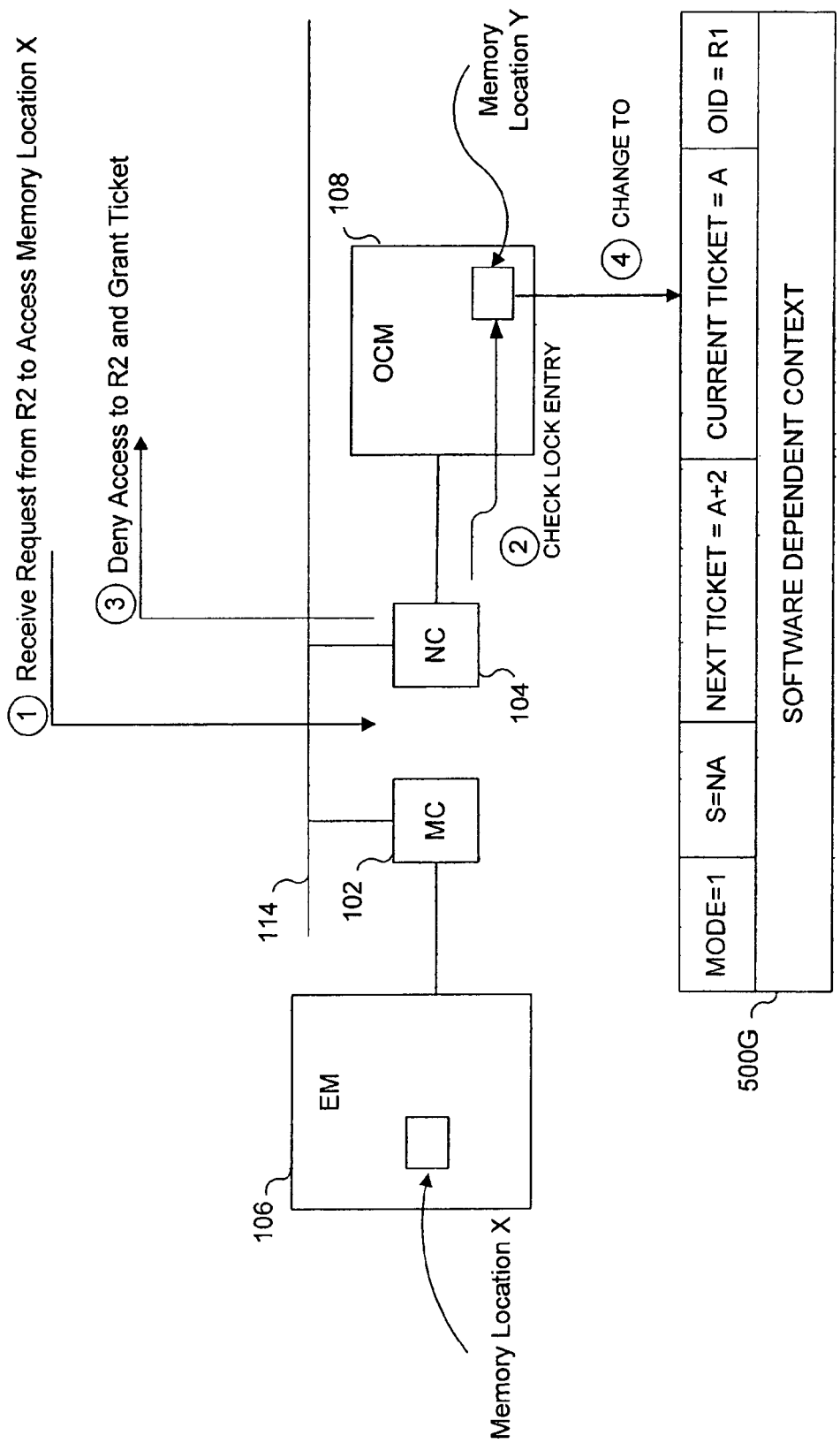
FIG. 5D2

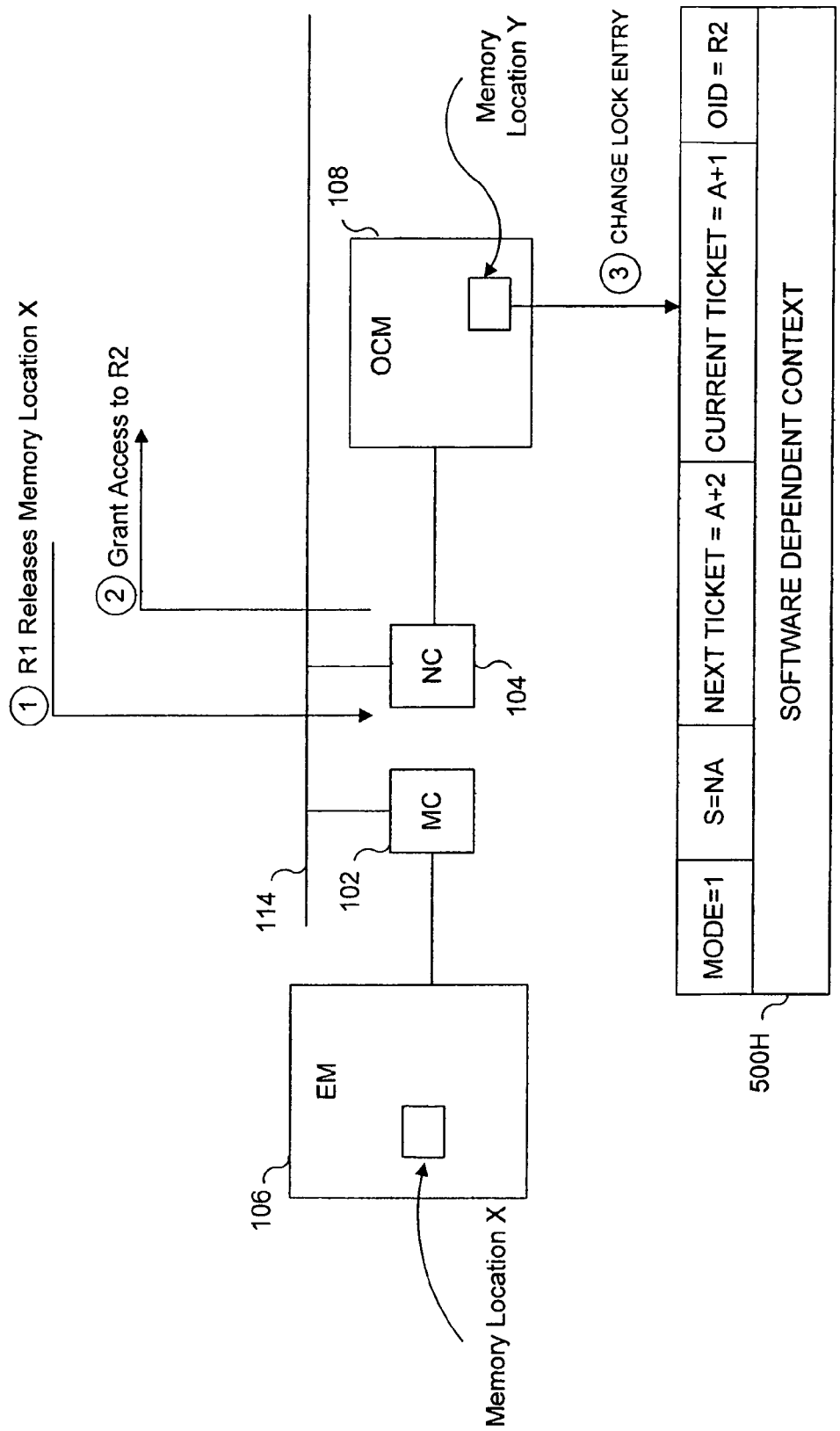
FIG. 5D3

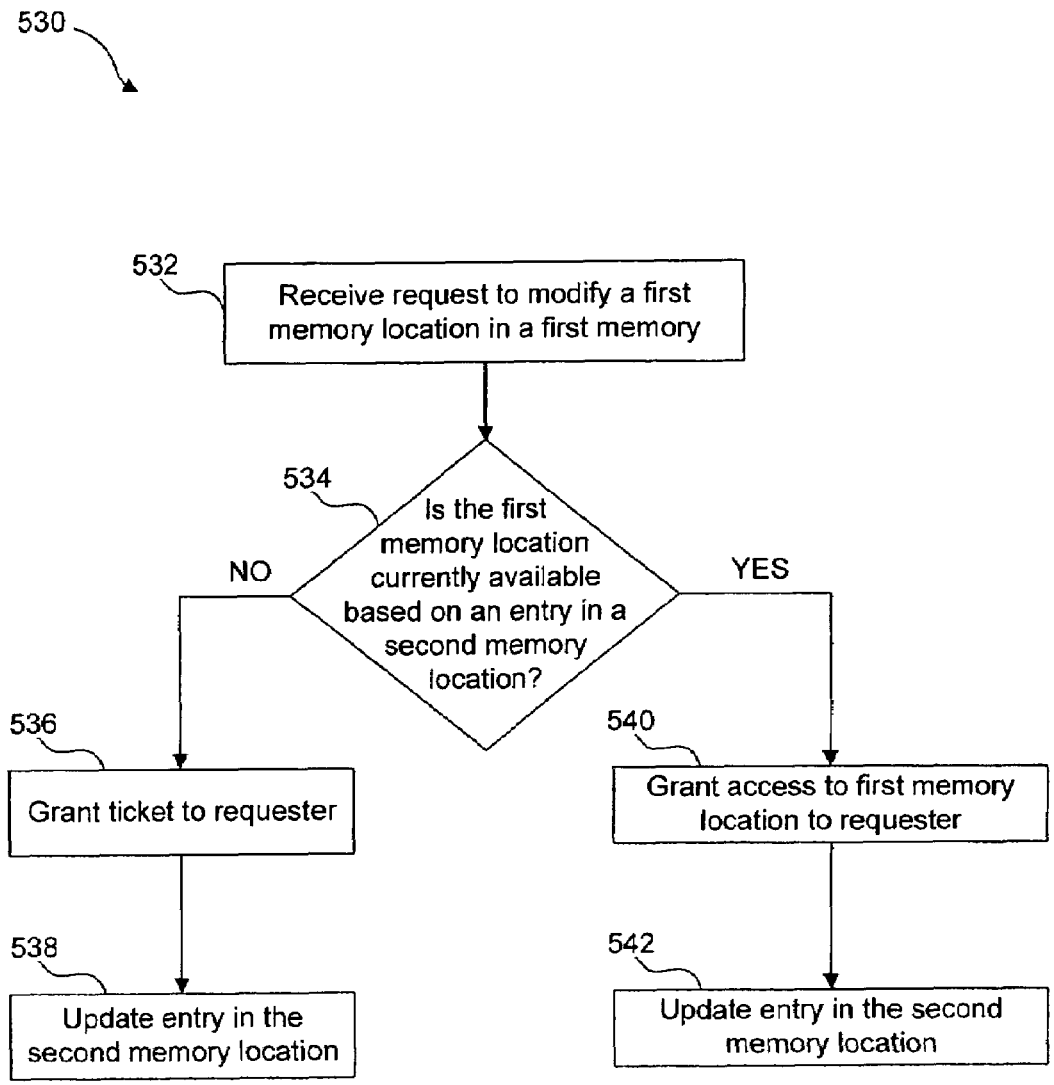
FIG. 5D4

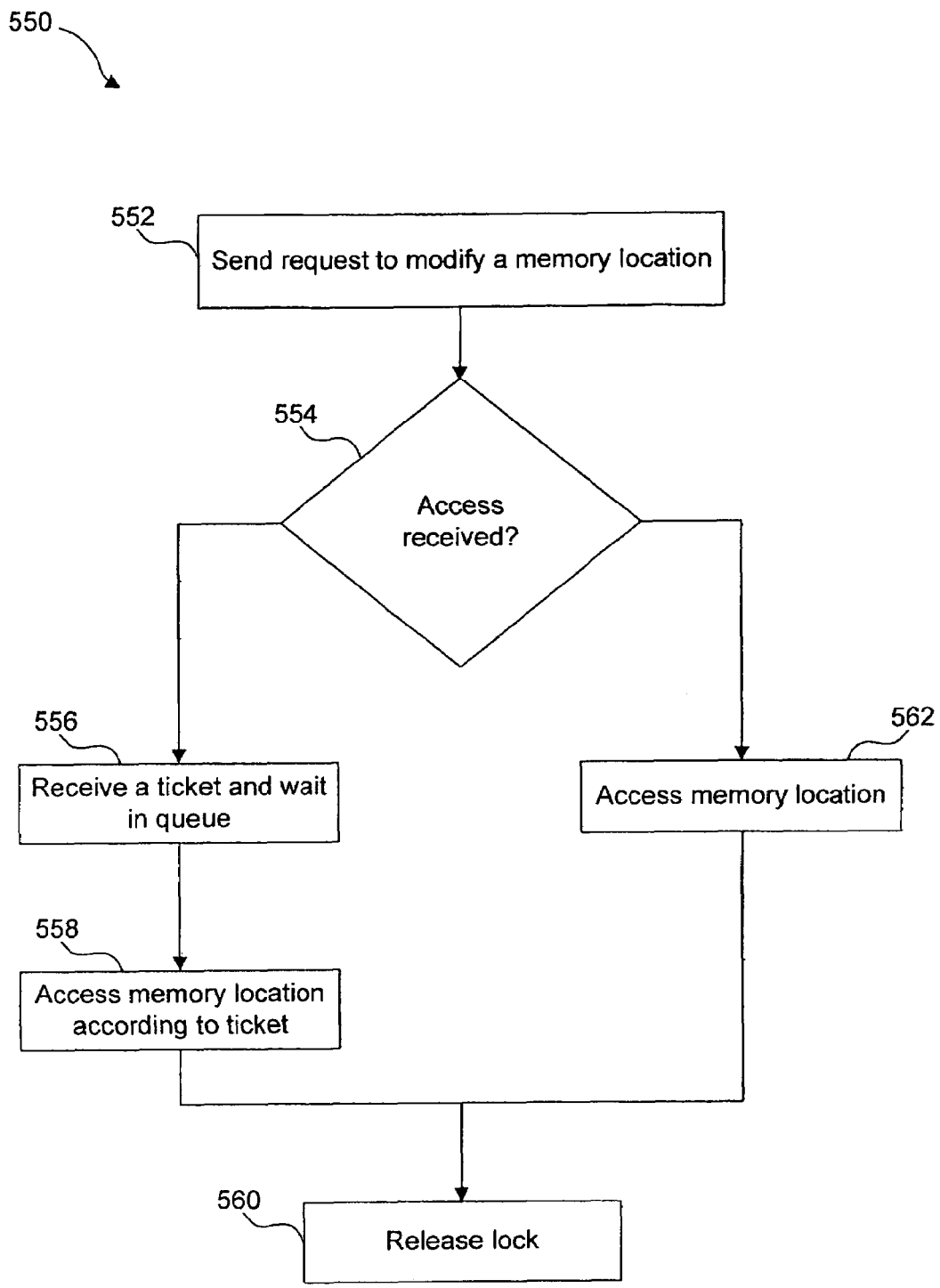
FIG. 5D5

HARDWARE MEMORY LOCKS

CROSS REFERENCE TO RELATED APPLICATIONS

This application is related to commonly owned U.S. patent application Ser. No. 11/529,356, titled "Memory Management in a Shared Memory System," filed on Sep. 29, 2006, and U.S. patent application Ser. No. 11/529,357, titled "Communication in a Cluster System," filed on Sep. 29, 2006, and U.S. patent application Ser. No. 11/529,623, titled "Global Address Space Management," filed on filed on Sep. 29, 2006, each of which is incorporated herein by reference in its entirety.

BACKGROUND OF THE INVENTION

1. Field of the Invention

The invention generally relates to memory systems and more specifically towards memory locks in memory systems.

2. Background Art

A System-on-a-chip (SOC) unit typically integrates multiple components of an electronic system onto a single chip. It may contain, for example, digital, analog, mixed-signal, and often radio-frequency functions all on one chip. A typical application of a SOC unit is in the area of embedded systems. However, most SOC units are specialized for a particular application and if used for an alternate application or configuration, some components remain unused. For example, a node controller and on-chip memory in a SOC may be utilized in one configuration and remain dormant in others. Besides SOC units, memory systems in general are configured for a single application and are not adaptable for use in alternate configurations.

Thus, what is needed are methods and systems to overcome the above mentioned deficiencies.

BRIEF SUMMARY OF THE INVENTION

Methods, systems and computer program products to implement hardware memory locks are described herein. A system to implement hardware memory locks is provided. The system comprises an off-chip memory coupled to a SOC unit that includes a controller and an on-chip memory. Upon receiving a request from a requester to access a first memory location in the off-chip memory, the controller is enabled to grant access to modify the first memory location based on an entry stored in a second memory location of the on-chip memory. In an embodiment, the on-chip memory is Static Random Access Memory (SRAM) and the off-chip memory is Random Access Memory (RAM).

In a sequencer mode, the controller grants access if the requester has a ticket value equal to a current ticket value stored in the entry. The controller increments the current ticket value after a requester releases the first memory location. The controller assigns a next ticket value and denies access to a requester if the first memory location is unavailable for modification based on the entry in the second memory location. The controller also increments the next ticket value in the entry upon assigning the next ticket value to the requester.

In a test-and-set mode, the controller grants access to modify the first memory location if a bit in the second memory location is a first value and denies access to modify the first memory location if the bit is a second value.

A method to implement a hardware memory lock is provided. The method comprises receiving a request from a requester to modify a first memory location in an off-chip memory and granting or denying access to modify the first memory location based on an entry stored in a second memory location of an on-chip memory. In the sequencer mode, if a request is denied, the method further comprises assigning a ticket value from a next ticket field in the second memory location to the requester. In the test-and-set mode, a request is denied if a specific bit in the entry is set to a first value.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
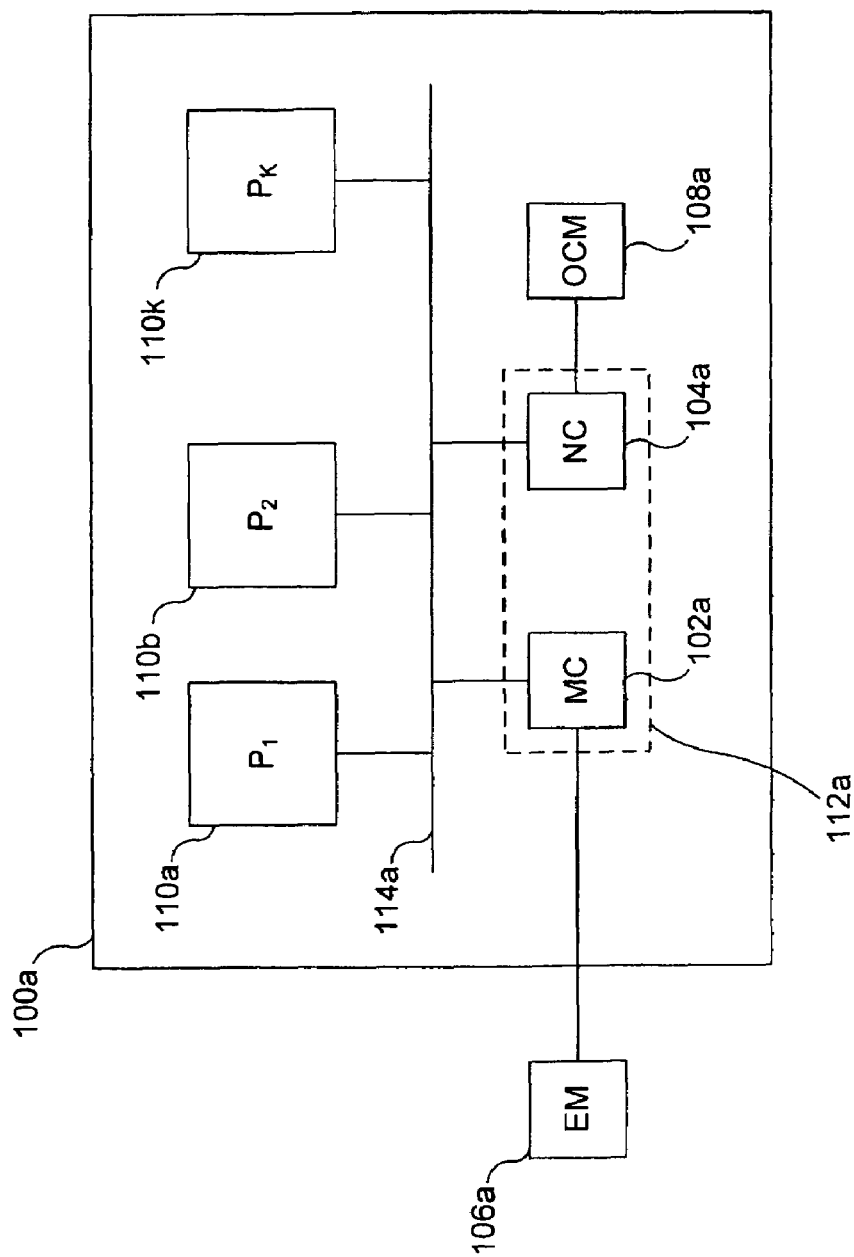
FIG. 1 illustrates an example System-On-a-Chip (SOC).

FIGS. 3C1-3C2 illustrate examples of maintaining memory coherency for an exclusive ownership request in a shared memory system according to an embodiment of the invention.

Figure 3A:
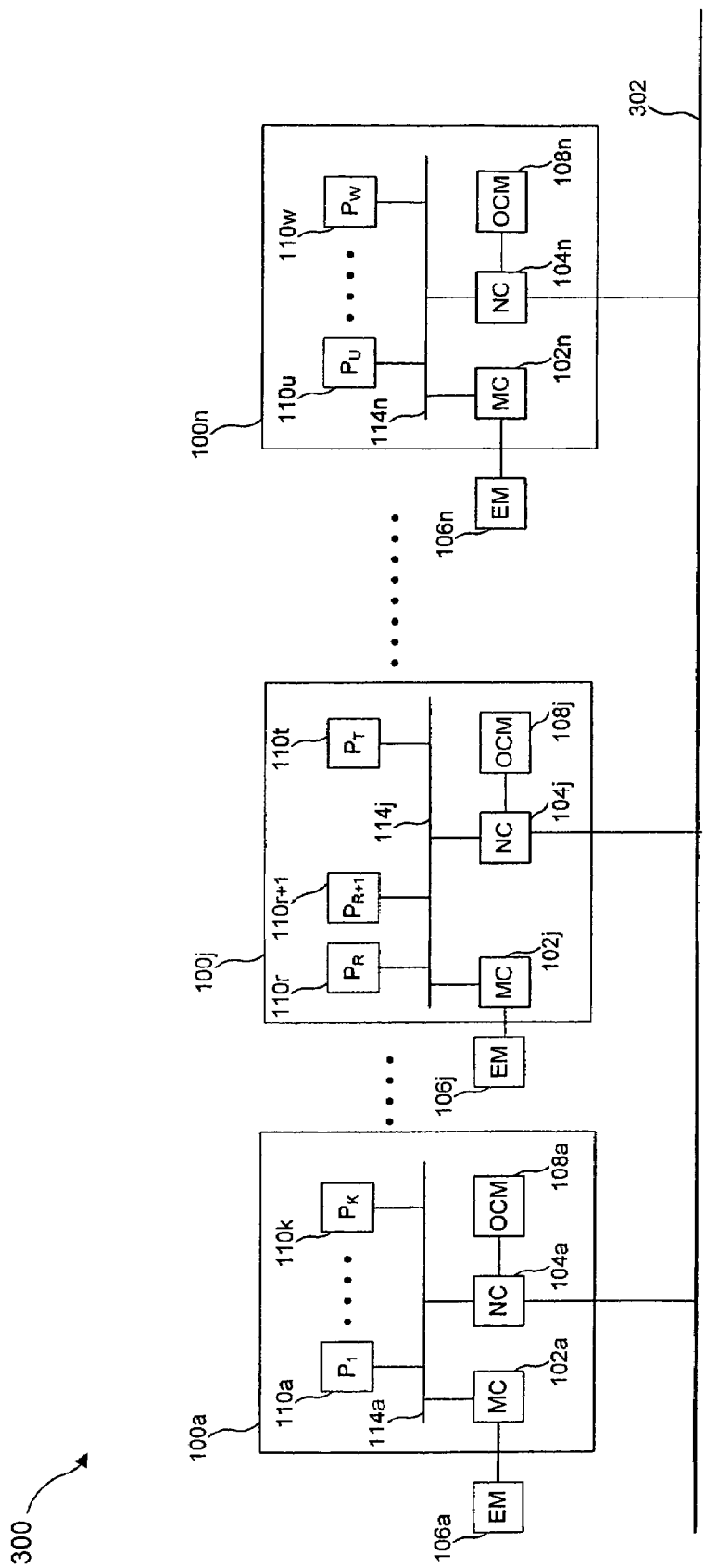
FIG. 3A illustrates an example shared memory system 300.
Figure 3B:
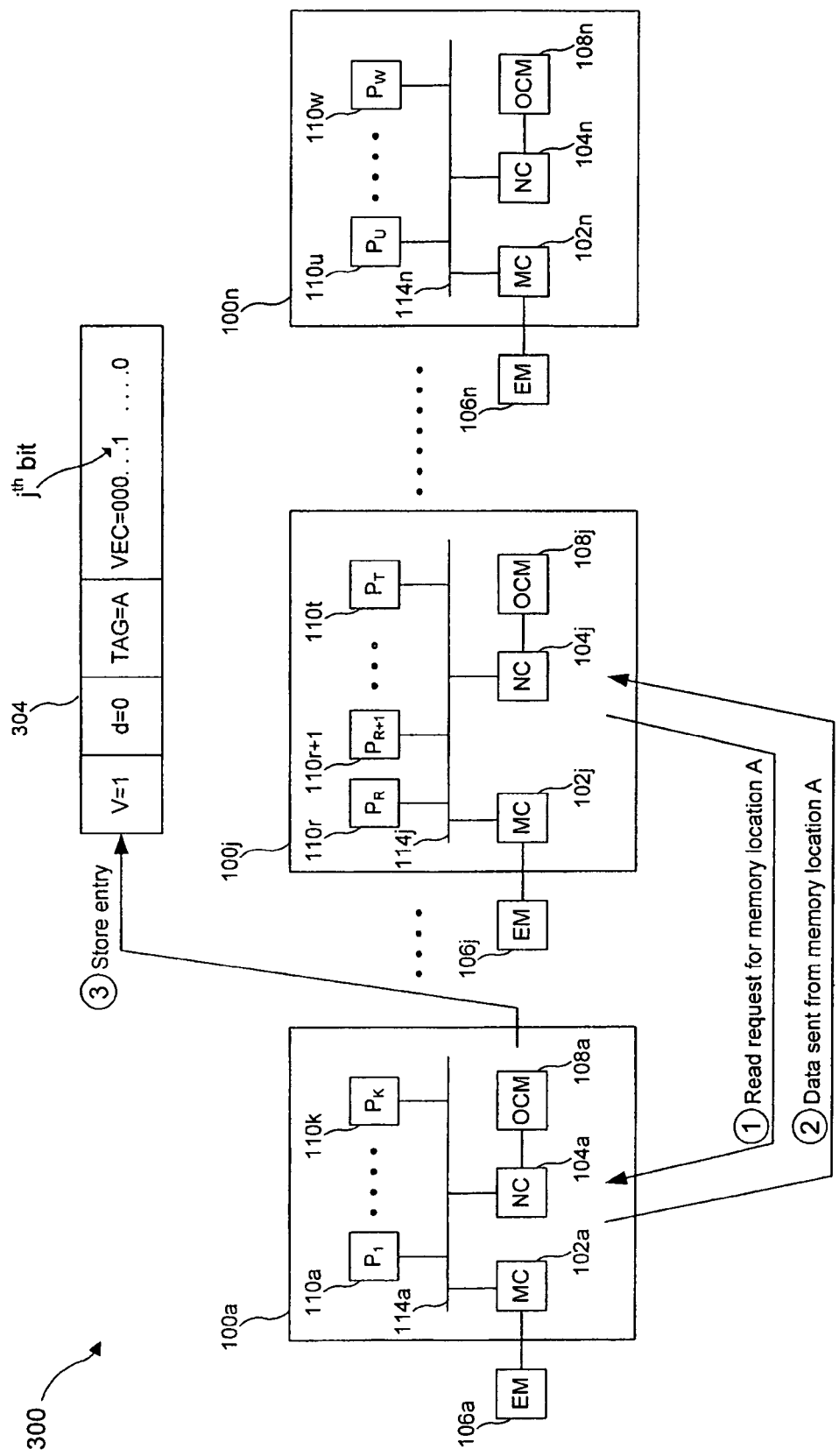
FIG. 3B illustrates an example of maintaining memory coherency in shared memory system 300 according to an embodiment of the invention.
Figure 3D:
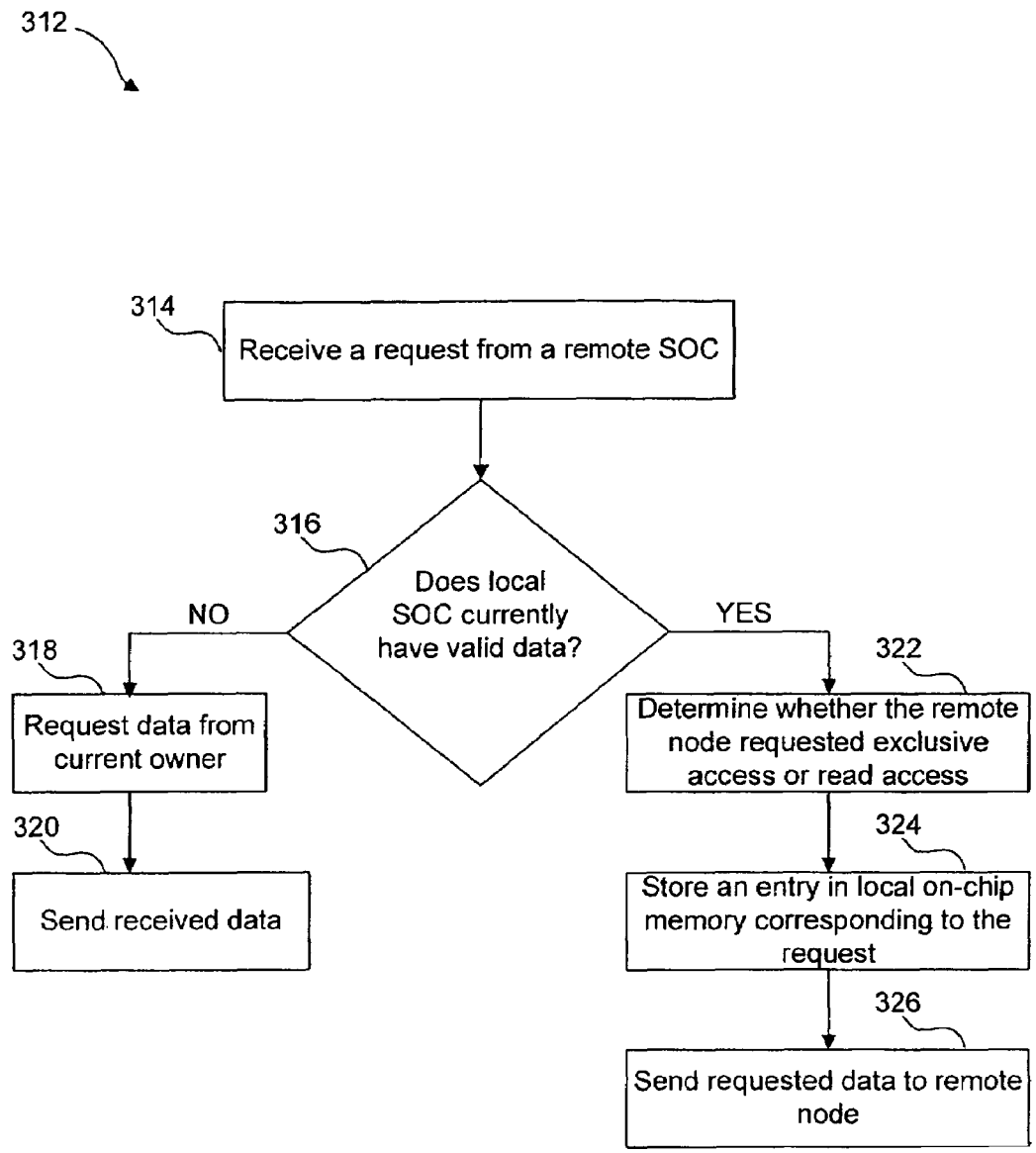

FIG. 3D illustrates an exemplary flowchart showing steps performed by a local SOC in a shared memory system, according to an embodiment of the invention.

Figure 3E:
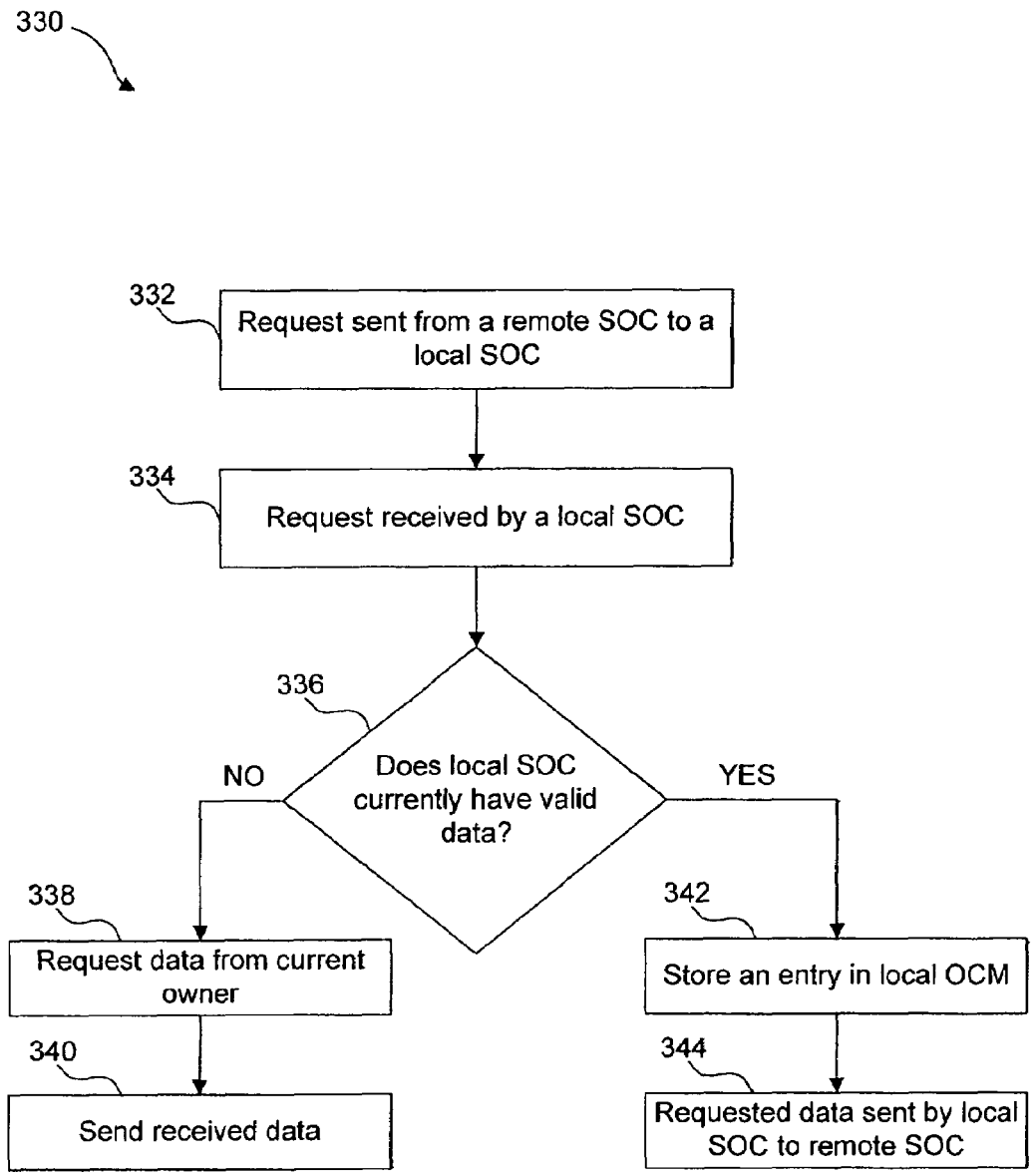

FIG. 3E illustrates a flowchart showing steps performed by a local SOC and/or a remote SOC in a shared memory system according to an embodiment of the invention.

Figure 3F:
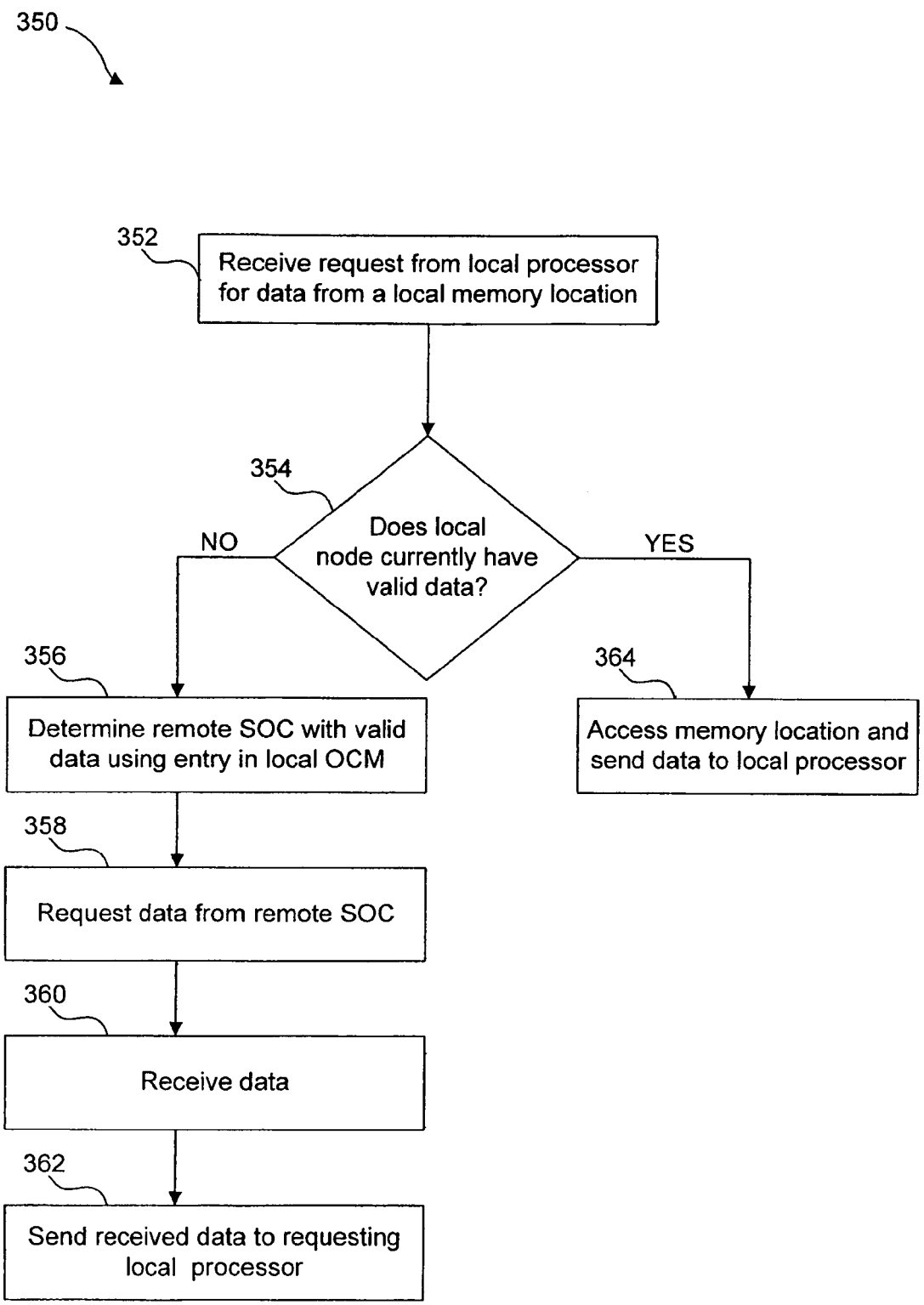

FIG. 3F illustrates a flowchart showing steps performed by a local SOC upon receiving a memory access request according to an embodiment of the invention.

Figure 4A:
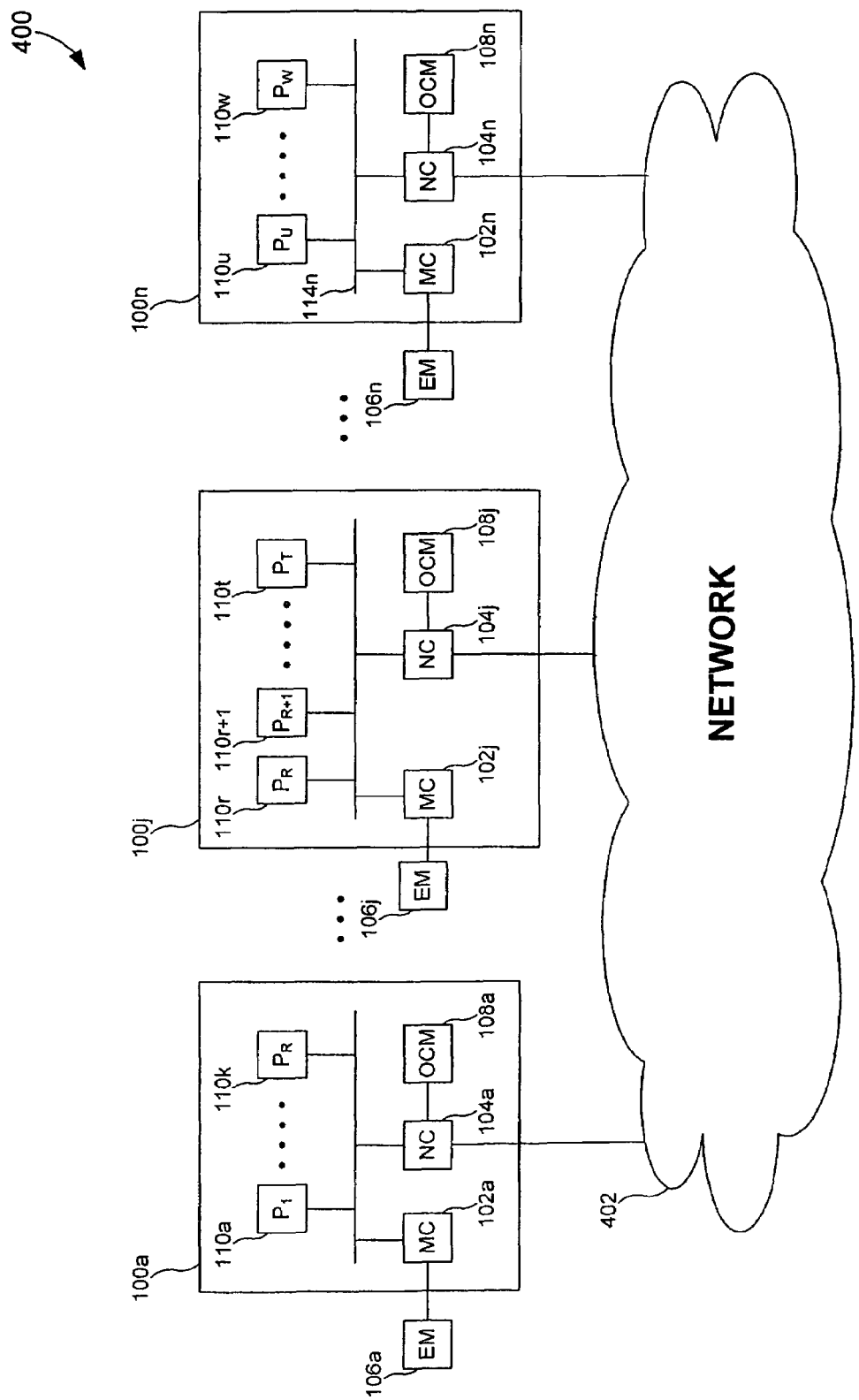

FIG. 4A illustrates an example cluster system.

Figure 4B:
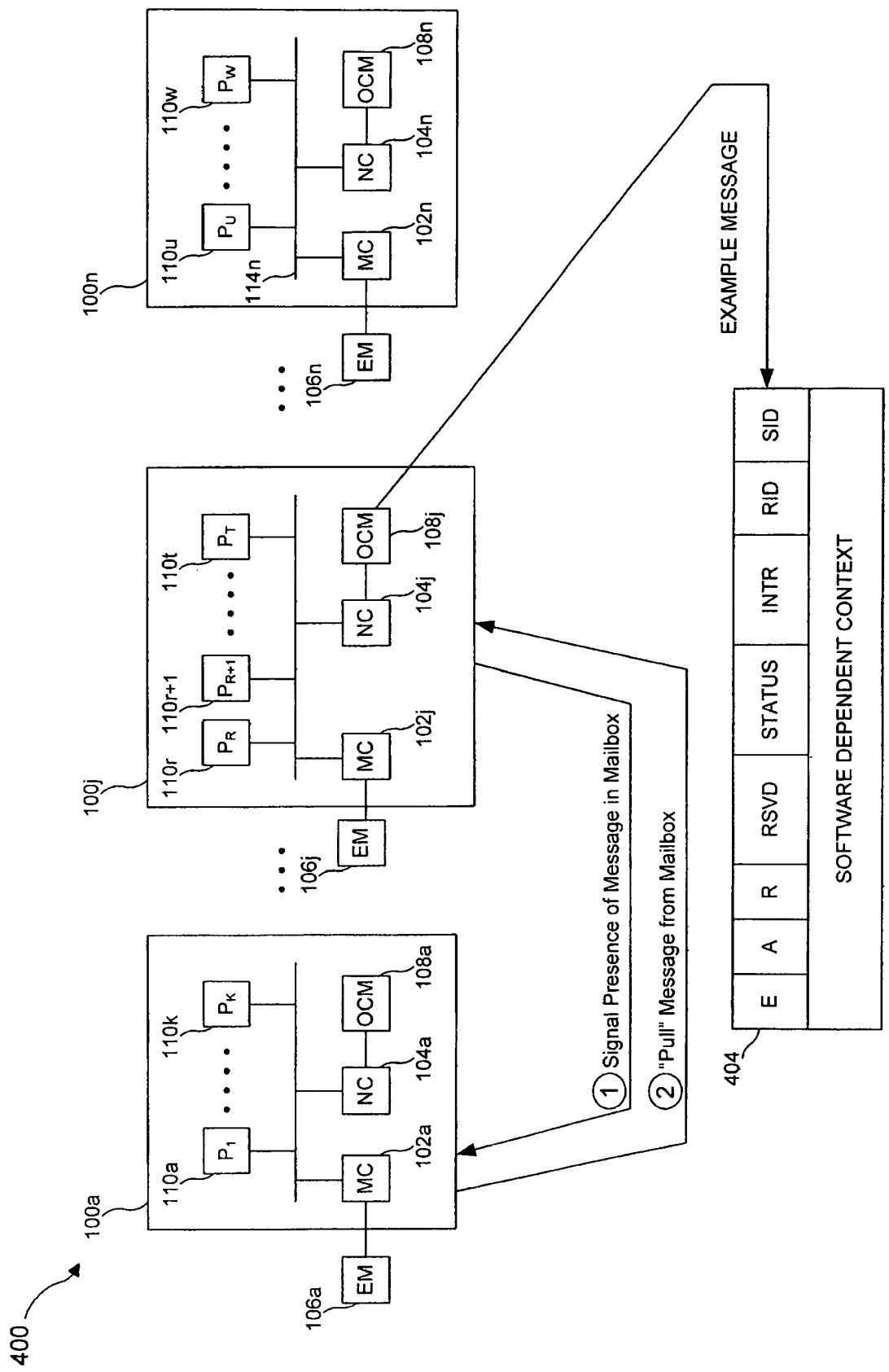

FIG. 4B illustrates pull model messaging according to an embodiment of the invention.

Figure 4C:
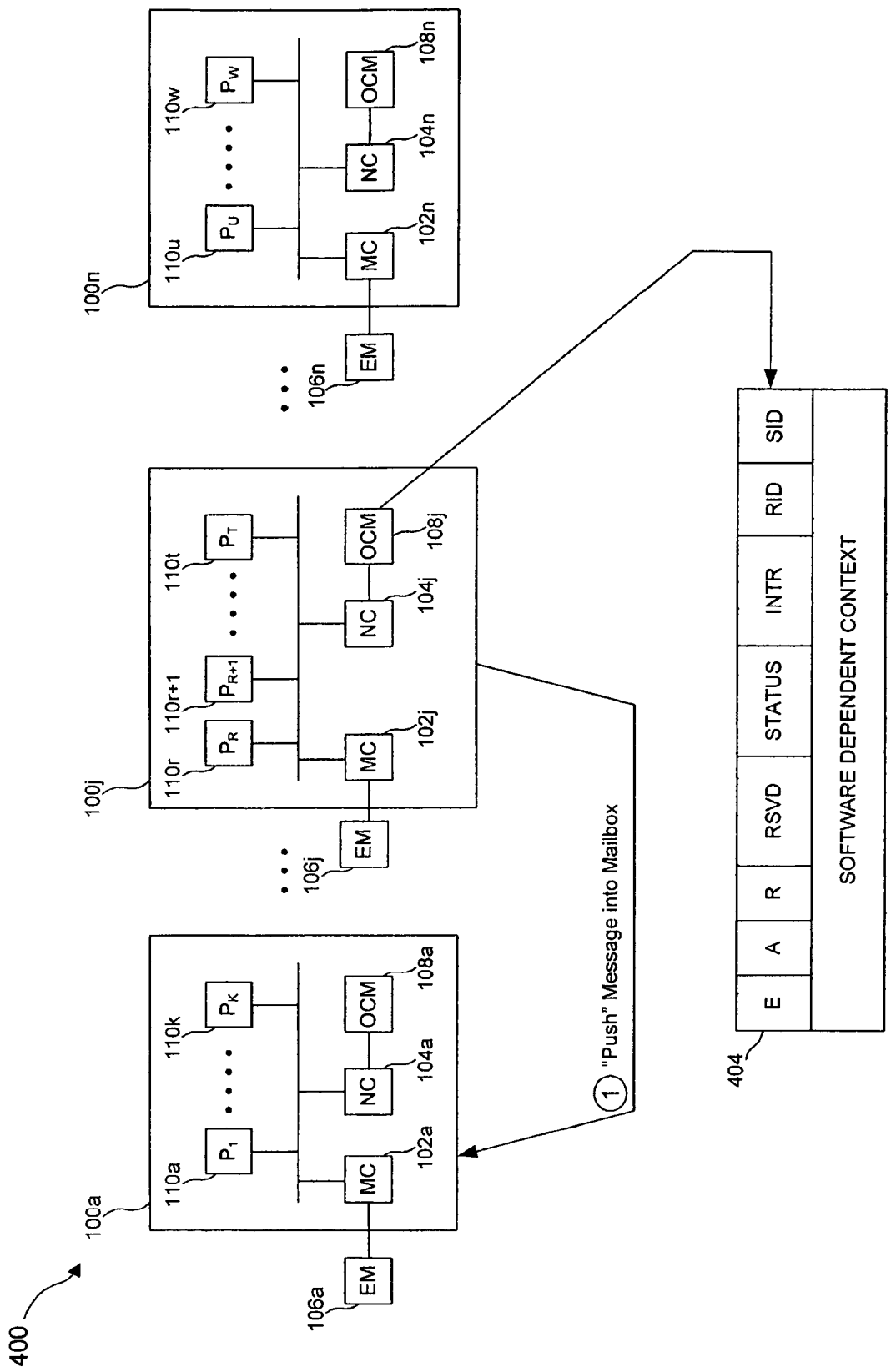

FIG. 4C illustrates push model messaging according to an embodiment of the invention.

Figure 4D:
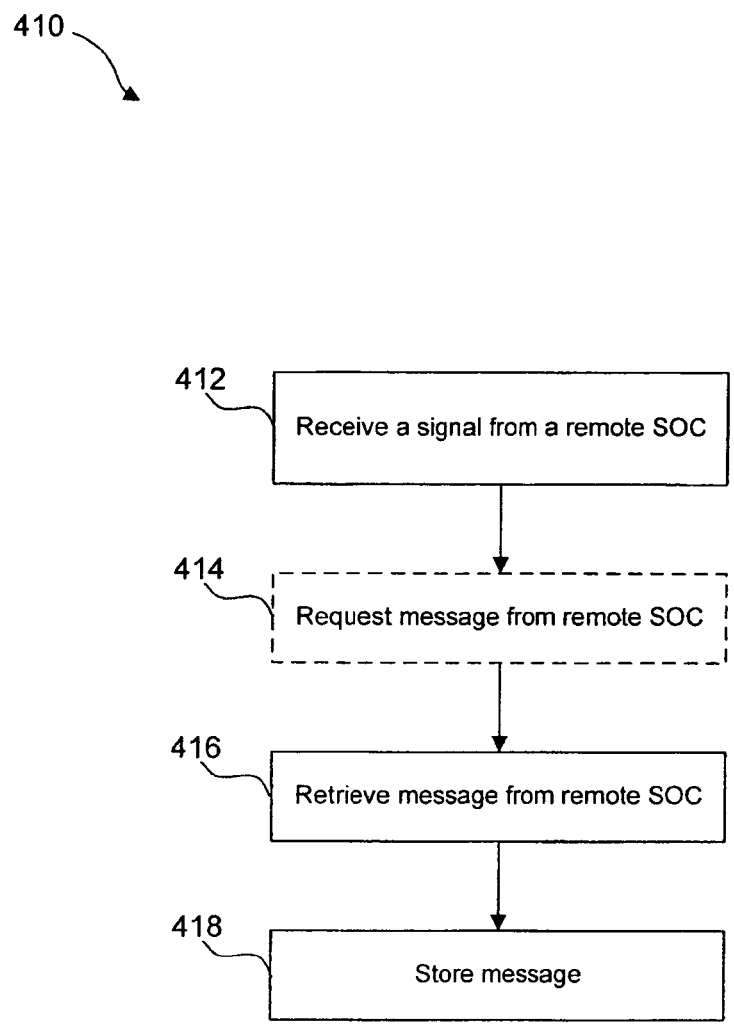

FIG. 4D illustrates a flowchart showing steps performed by a local SOC implementing pull model messaging according to an embodiment of the invention.

Figure 4E:
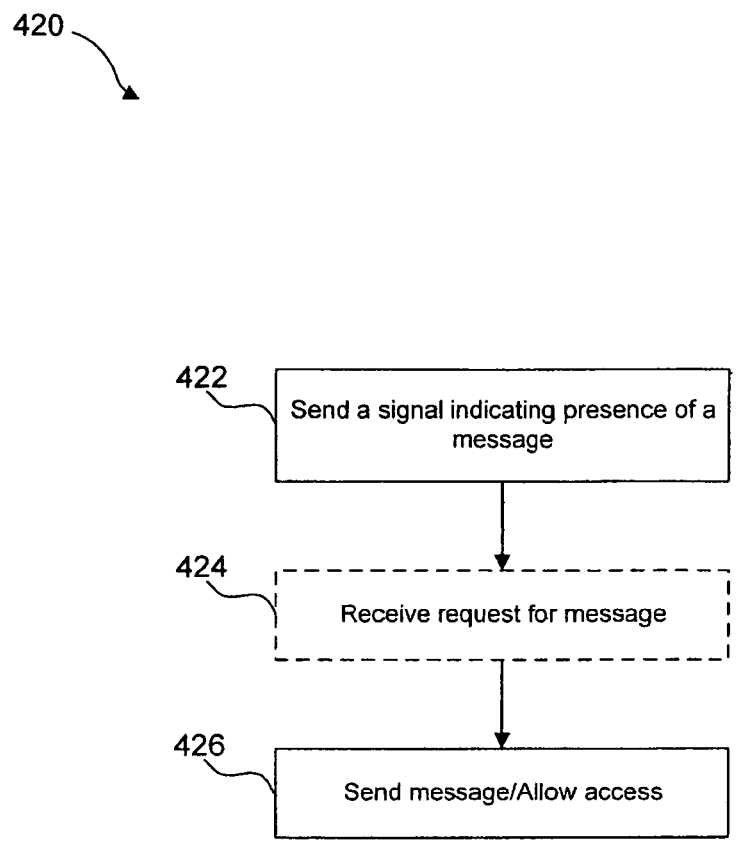

FIG. 4E illustrates a flowchart showing steps performed by a remote SOC implementing pull model messaging according to an embodiment of the invention.

Figure 4F:
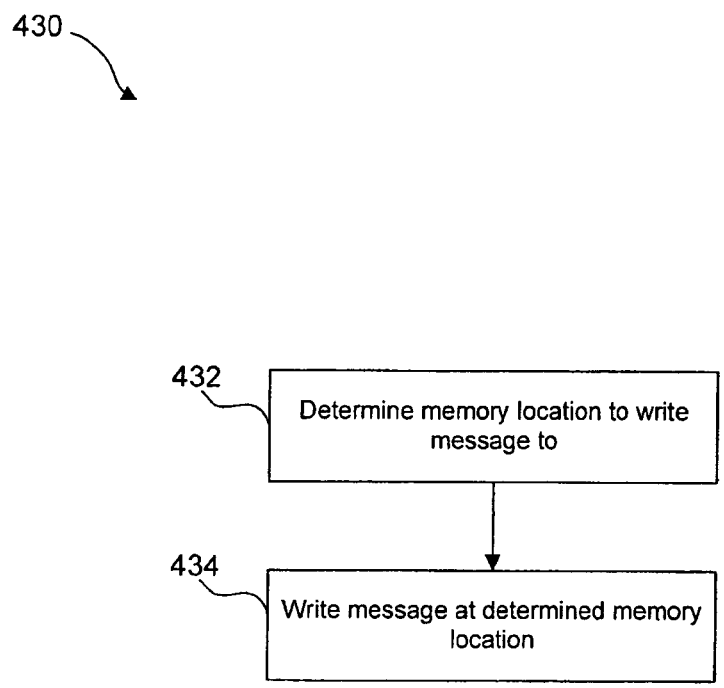

FIG. 4F illustrates a flowchart showing steps performed by a remote SOC implementing push model messaging according to an embodiment of the invention.

Figure 5A:
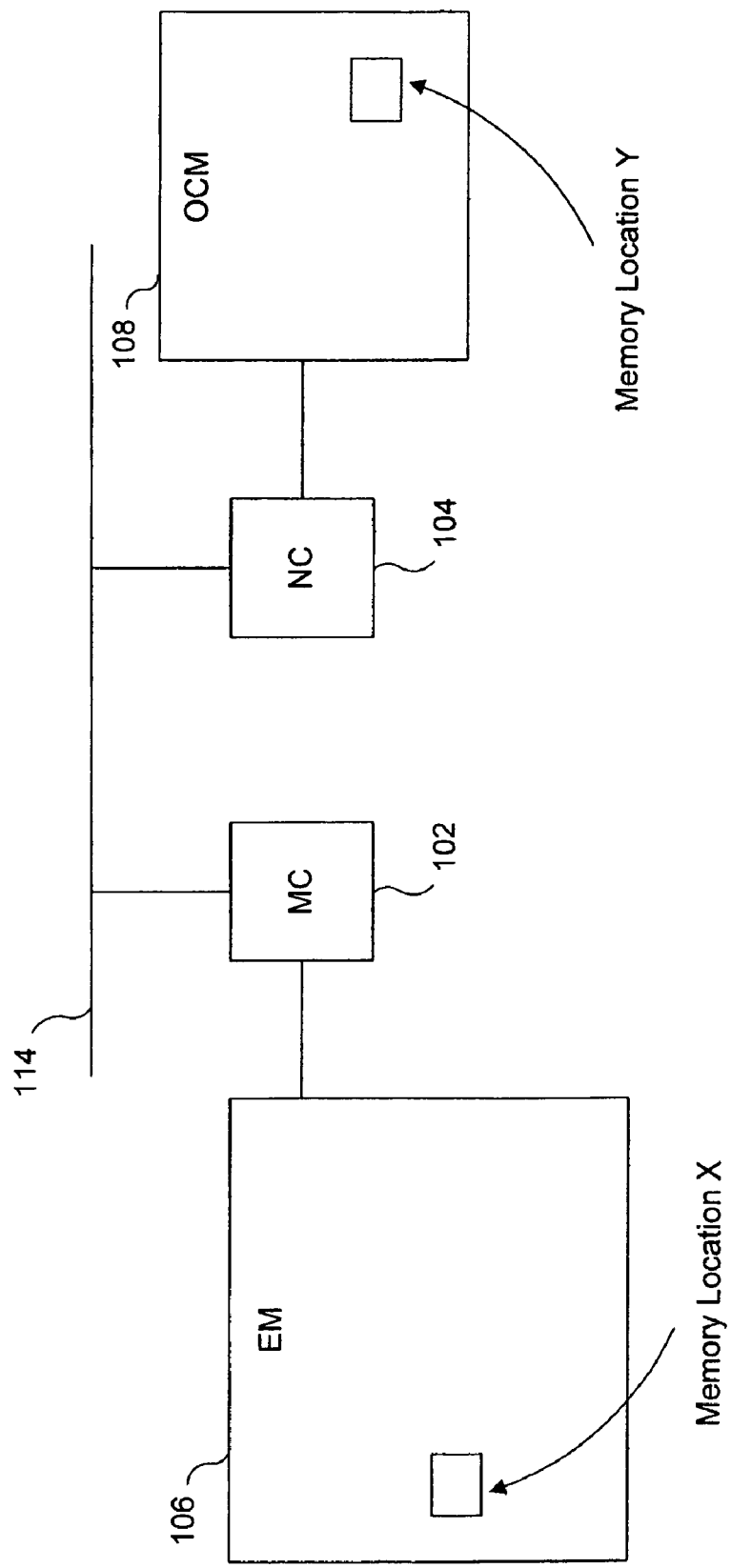

FIG. 5A illustrates example association between memory locations and memory locks according to an embodiment of the invention.

Figure 5B:
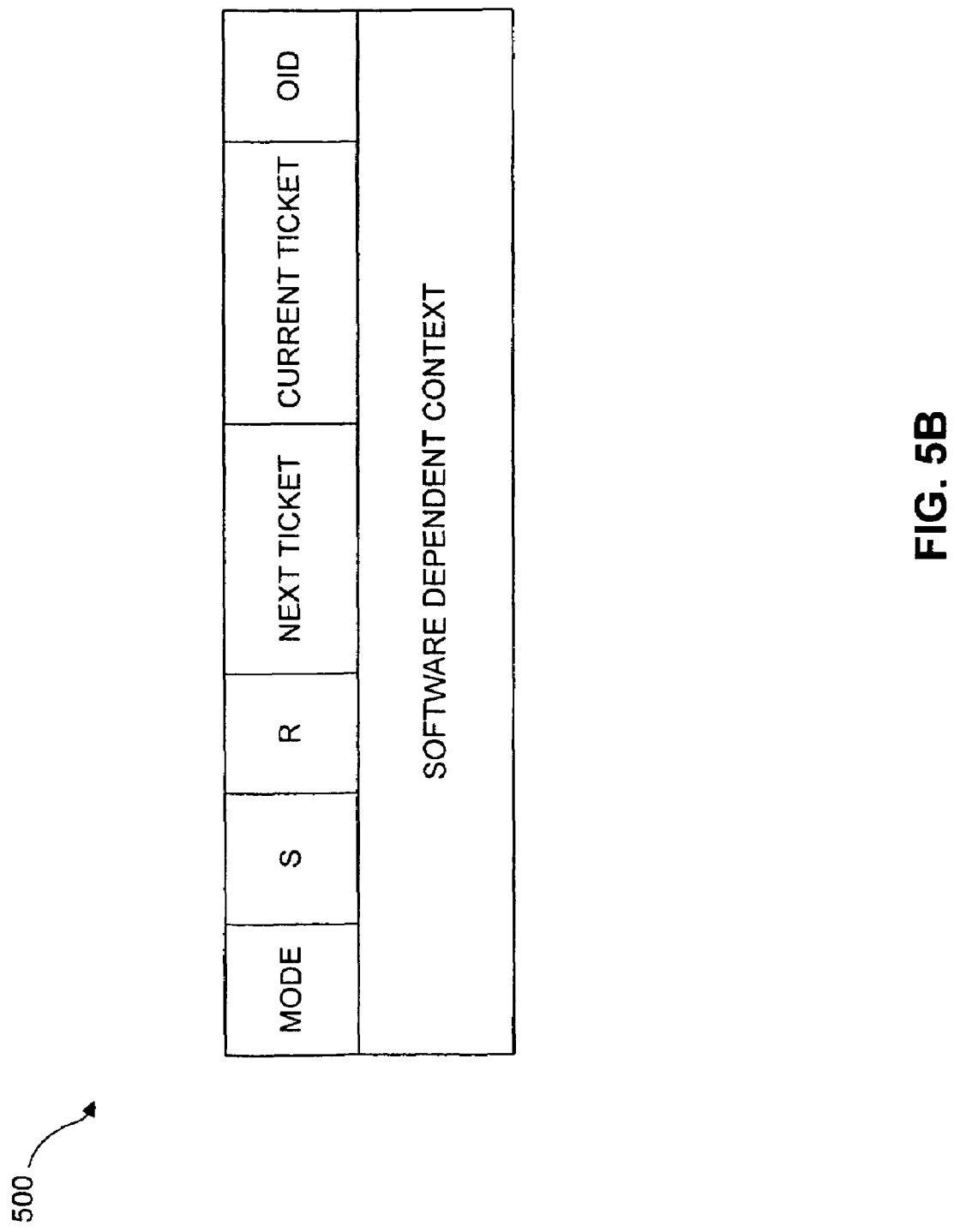

FIG. 5B illustrates an example lock entry.

FIGS. 5C1-5C3 illustrate example operation of memory locks in test-and-set mode according to an embodiment of the invention.

FIG. 5C4 illustrates a flowchart showing steps performed by a node controller in test-and-set mode, according to an embodiment of the invention.

FIGS. 5D1-5D3 illustrate example operation of memory locks in sequencer mode according to an embodiment of the invention.

FIG. 5D4 illustrates a flowchart showing steps performed by a node controller in sequencer mode, according to an embodiment of the invention.

FIG. 5D5 illustrates a flowchart showing steps performed by a requester in sequencer mode, according to an embodiment of the invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

Methods and systems for a multi-purpose adaptable memory are described herein. In particular, methods and systems for adapting the on-chip memory of a SOC to serve different purposes in different applications are described.

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Example System-On-a-Chip (SOC)

Before describing embodiments of the present invention in detail, it is helpful to describe an example environment in which the invention may be implemented. In an example environment, embodiments of the invention are implemented on a multi-processor System-On-a-Chip (SOC) unit which includes on-chip memory and is coupled to external memory. FIG. 1 illustrates a SOC 100a which includes k processors 110a-k, a memory controller (MC) 102a, a node controller (NC) 104a, on-chip memory (OCM) 108a and external memory (EM) 106a. In an alternate embodiment, memory controller 102a and node controller 104a may be combined into a global controller 112a which combines the functionality of memory controller 102a and node controller 104a. Processors 110a-k may each include an associated cache (not shown). Processors 110a-k may be used in a simultaneous multi-processing configuration. Processors 110a-k are tied together with a high-speed channel or interconnect bus such as bus 114a and may share workload or operate individually.

Processors 110a-k may also be configured so that if a processor is inoperative, another processor takes over in its stead. Memory controller 114a is typically used to control external memory 106a and may also be used to control caches of processors 110a-k in the absence of cache controller(s) (not shown). Memory controller 114a typically includes an address decoder (not shown) that generates the necessary signals to control the reading and writing of information from memory such as EM 106a and caches (not shown) of processors 110a-k. MC 114a may also interface external memory 106a with other components of SOC 100a via, for example, bus 114a. NC 104a is used to communicate amongst processors 110a-k. NC 104a may also be used as an interface to communicate with other SOC units or processors on other SOC units. Node controller 104a may be coupled to other Soc units via a high speed bus (not shown) such as PCI-E or HT to enable rapid inter-SOC communication. Node controller 114a may also include an address decoder (not shown) that generates the necessary signals to control the reading and writing of information from OCM 108a. In an embodiment, NC 104a may be used to configure and use OCM 108a for varied purposes. For example, if a SOC 100a is in a cluster configuration, OCM 108a may be used as a message mailbox for communication amongst SOC units in the cluster while maintaining the integrity and security of EM 106a. In a cache coherent non-uniform memory access system, OCM 108a may be used to maintain cache coherency. OCM 108a may also be configured to be store locks for memory locations in EM 106a. OCM 108a may also be used as part of a global address space, as a fast access memory. The utilization of OCM 108a is configured and controlled by NC 104a. In another embodiment, global controller 112a or MC 102a may configure and control OCM 108a as required.

For clarity and ease of illustration, not all functional blocks of SOC 100a are illustrated in detail because these items are known to those of ordinary skill in the art. Furthermore, it is to be appreciated that similar or substitute functional blocks of SOC 100a may be used to implement embodiments of the invention without deviating from the scope of the present invention. Example configurations of OCM 108a and NC 104a according to embodiments of the invention are described in further detail below. Such example configurations are not limited to OCM 108a or NC 104a and may be used in alternative environments. Furthermore, the embodiments described herein may be adapted and modified, as would be apparent to persons skilled in the relevant art(s).

Global Address Space Management

Figure 2A:
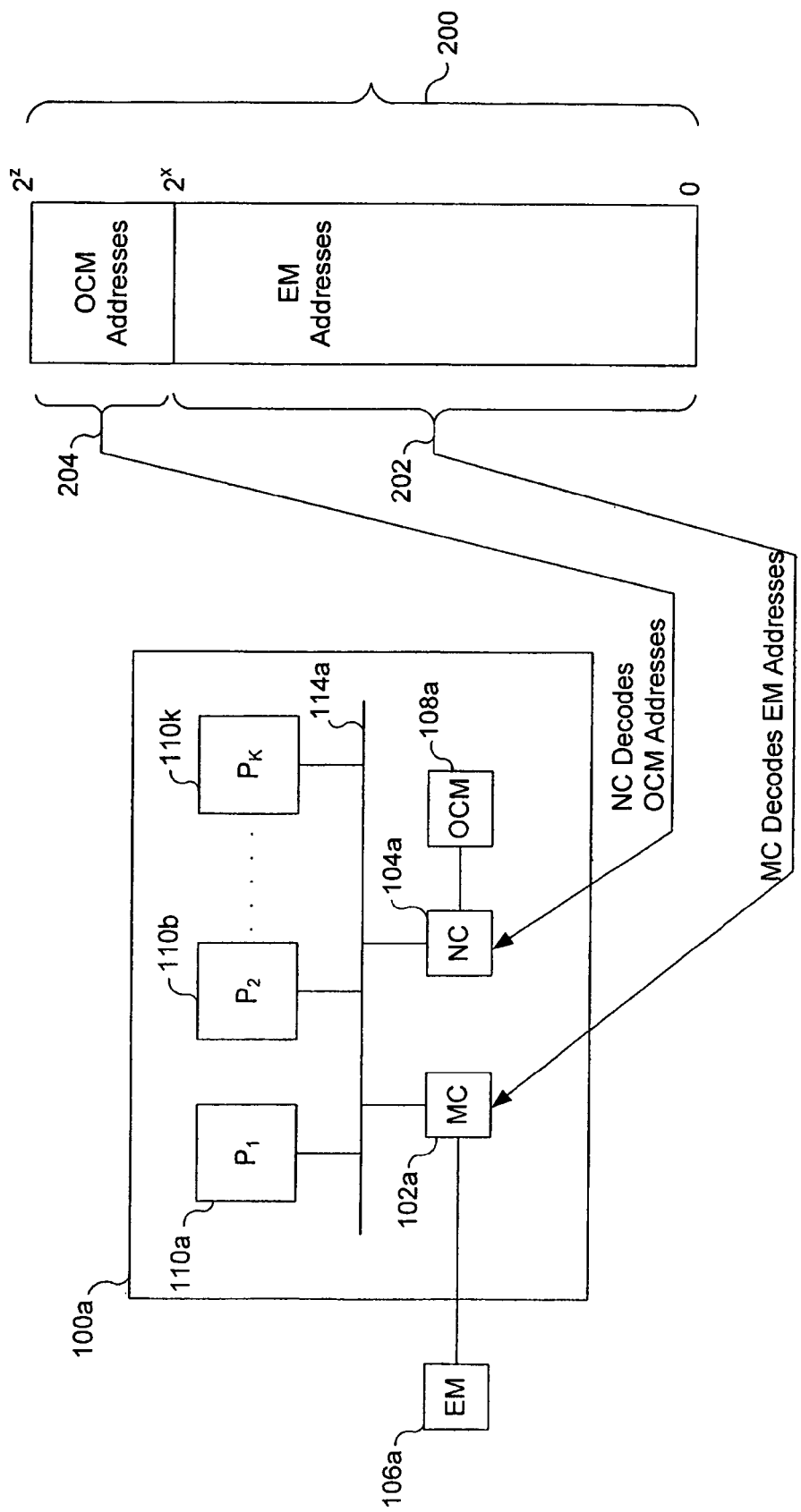
FIG. 2A illustrates an example SOC and an associated global address space according to an embodiment of the invention.

FIG. 2A illustrates a block diagram of SOC 100a and a global address space 200 according to an embodiment of the invention. Global address space 200 represents the range of addresses used by processors 110a-k to access memory locations. The number of processors k is arbitrary. Typically, an address space utilized by processors 110a-k may include only external memory addresses 202 of EM 106a and all memory accesses are handled by memory controller 102a. In typical configurations, OCM 108a may belong to a separate address space. In this embodiment, OCM addresses 204 of OCM 108a are part of a global address space 200 that includes external memory address 202 of EM 106a. In an embodiment, OCM addresses 204 in global address space 200 are decoded by an address decoder (not shown) in node controller 104a whereas EM addresses 202 are decoded by an address decoder (not shown) in memory controller 102a. Use of a global address space enables utilization of faster OCM 108a without having to assign and decode memory addresses from a separate address space. Another advantage, is a larger contiguous address space. Global address space according to the present embodiment, extends from 0 to $2^z$ with 0 to $2^x$ being EM addresses 202 and $2^x$ to $2^z$ being OCM addresses 204 (wherein x and z are positive numbers and z is greater than x). For example, if size of EM 108 is 1 Gigabyte (GB), then EM addresses range from 0 to ($2^{30}$−1) (i.e. x is 30). If size of OCM 108a is 4 Megabytes (MB), then OCM addresses in a global address space, will range from $2^{30}$ to ($2^{32}$−1) (i.e. z is 32). Therefore, by combining EM addresses 202 and OCM addresses 204, global addresses 200 ranges from 0 to ($2^{32}$−1) instead of 0 to ($2^{30}$−1). Furthermore, if certain applications require fast memory access, they can utilize OCM 108a by using addresses in the range of $2^x$ to ($2^z$−1), or as in the present example, the range of $2^{30}$ to ($2^{32}$−1).

As shown in FIG. 2A, memory controller 102a and node controller 104a receive read or write requests with associated addresses from, for example, processors 110a-k. Node controller 104a determines whether the address falls within its range of $2^x$ to ($2^z$−1). If an address falls within the range of $2^x$ to ($2^z$−1), then node controller 104a decodes the supplied address and completes the requested read or write request by accessing the corresponding memory location in OCM 108a. If an address falls within the range of 0 to ($2^x$−1), then memory controller 102a, decodes the supplied address and performs the requested read or write request by accessing the corresponding memory location in external memory 106a.

Figure 2B:
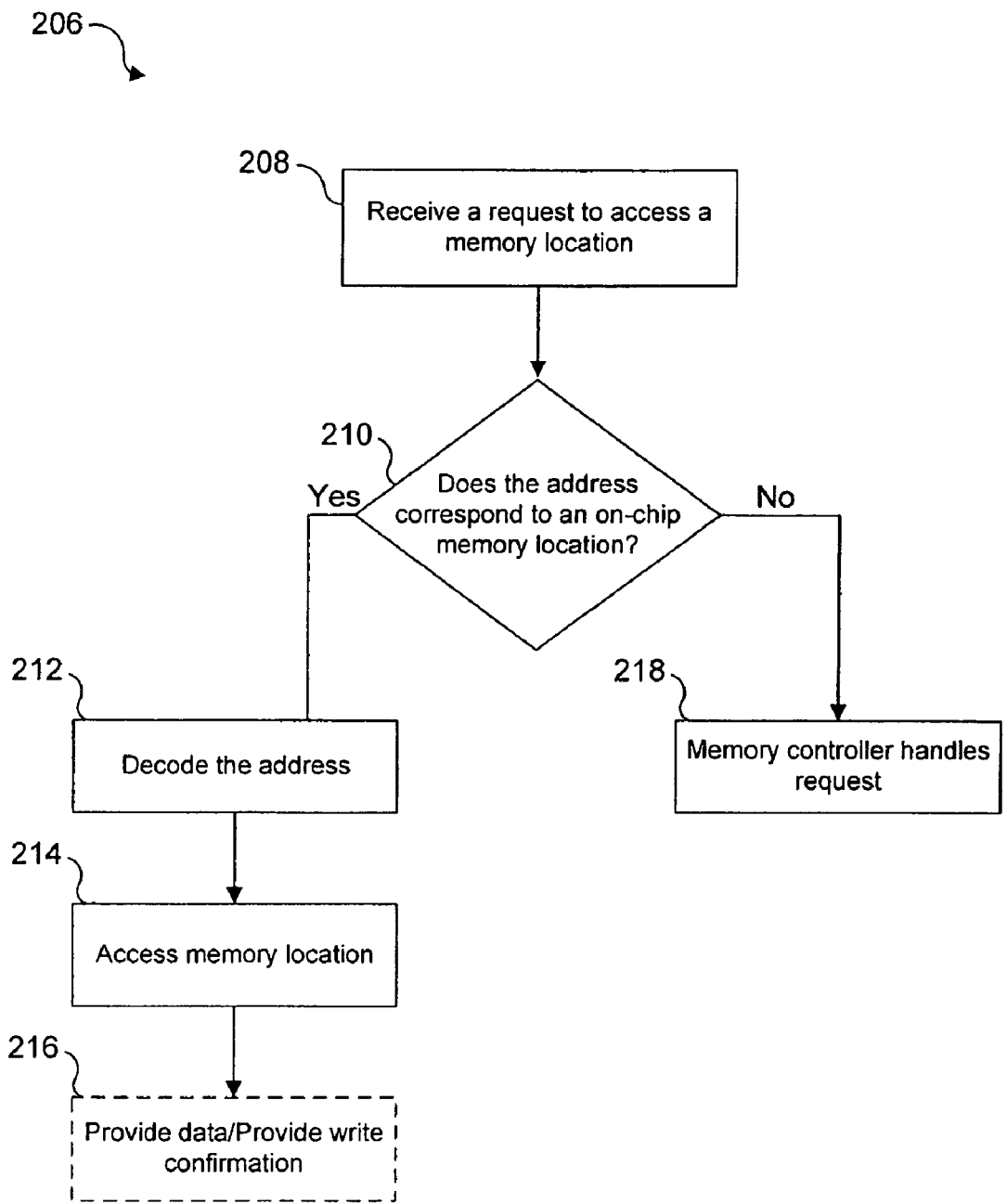
FIG. 2B illustrates an example flowchart showing steps performed by a node controller in a SOC using a global address space according to an embodiment of the invention.

FIG. 2B illustrates an example flowchart 206 showing steps performed in a SOC using a global address space according to an embodiment of the invention. In an embodiment, the steps are performed by a node controller in the SOC unit.

In step 208, a request to access a memory location is received. The request includes an address of the memory location, whether it is a read or write request and the data to written if it is a write request.

In step 210, it is determined whether the address in the request received in step 210 corresponds to an on-chip memory location.

In step 212, if it is determined in step 210 that the address corresponds to an on-chip memory location, then the address is decoded. The address is typically decoded by an address decoder in the node controller. Decoding the address results in conversion of the address into electrical signals required to access the on-chip memory.

In step 214, based on the decoded address from step 212, the memory location is accessed and data is retrieved or stored, as specified by the instruction received in step 208.

In optional step 216, if the request received in step 208 was for reading data from memory, then the required data is supplied to the requesting service. In an embodiment, if the request received in step 208 was a write request, then a write confirmation may be provided to the requesting service upon completion of the write.

In step 218, if it is determined in step 210 that the address corresponds to an external memory location then the request is transferred to a memory controller. An address decoder in the memory controller decodes the address, accesses the external memory location and provides requested data or a write acknowledgement depending on the requirements of memory access request received in step 208.

Example embodiments describing a shared memory configuration for a node controller and on-chip memory are described below.

Example Shared Memory System

FIG. 3A illustrates an example shared memory system 300. In an embodiment, shared memory system 300 is a cache coherent Non-Uniform Memory Access (CC-NUMA) system. System 300 includes n SOC units 100a-n connected via a high speed interconnect 302 such as PCI-E or HT. The number of SOC units n and the number of processors in each SOC is arbitrary. In an embodiment, node controllers 104a-n are coupled via interconnect 302 thereby providing an interface for communication amongst SOCs 100a-j.

Processors 100a-n share a global address space. External memory 106a-n and/or caches of processors in each SOC are mapped into global address space. In embodiments of the invention, OCM 108a-n is not mapped into the global address space. In a shared memory system 300, maintaining cache coherence across memory shared by multiple processors in multiple SOCs is slow and has a significant processing overhead on processors. Embodiments of the invention described below offer a novel solution by utilizing OCM 108 via NC 104 as a cache directory to track location of shared data in system 300. As described below, each OCM 108a-n is used by its corresponding SOC 100a-n as a directory to track shared data in system 300. OCM 108a tracks shared data by storing entries for shared memory location. In an embodiment, each entry includes, but is not limited to, the following fields:

Field Valid (v) to indicate whether the a remote node has a valid copy of the data;

Field Dirty (d) to indicate whether the data sent to the remote node is modified by the remote node i.e. whether the remote node made an "exclusive ownership" request for the data;

Field Tag to identify the local memory location requested; and

Field Vector (vec) to identify the remote SOC that requested data from the memory location. For example, vec may include multiple bits where each bit corresponds to a SOC in system 300. In the example in FIG. 3A, if SOC 100j requested the data, the $j^{th}$ bit of the vec field is set to 1 to indicate that SOC 100j requested data. In an alternate embodiment, the processor $P_T$ of SOC 100j may be indicated in the vec field as the originator of the request by setting the Tth bit of the vec field to 1.

In the example presented below with reference to FIG. 3A, SOC 100a is referred to as a local SOC corresponding to local memory location B in EM 106a. All other SOCs 100b-100n are referred to as remote SOCs. Entries in OCM 108a are used to keep track of which SOC has a copy of data corresponding to a memory location B in EM 106a. There can be as many as copies of the data in memory location B in system 300 as there are SOCs in system 300. Since system 300 has n SOCs, n copies of data in memory location B can exist in system 300. Shared copies of data have the same value. When a SOC is to modify a memory location having shared data, it must acquire exclusive ownership of the memory location and all other cached copies must be invalidated. Example cases are described below:

When a remote SOC 100j issues a read request to local SOC 100a for memory location B in EM 106a, node controller 104a checks if an entry corresponding to memory location B with a dirty bit set exists in OCM 108a. If no such entry exists in OCM 108a, local memory 106a has valid data and node controller 104a provides data from memory 106a to requesting remote SOC 100j. If a dirty copy exists in, for example, SOC 100n, a corresponding dirty entry exists in OCM 108a with the n-th bit of the vector field in that entry set to 1. Node controller 104a issues a write-back command to the current owner SOC 100n to provide the most recent data of the location B. After SOC 100n returns the data, the node controller 104a writes the data back to local external memory 106a and also provides it to the requesting SOC 100j. The OCM 108a entry is modified such that the dirty bit is reset to 0 and the j-th and n-th bit in the vector are set to 1. This means that SOC 100j and SOC 100n have a shared, clean data copy of the memory location B. Their values are consistent with the memory copy in EM 106a.

When a local processor of SOC 100a issues a read request, entries in OCM 108a are checked. If no remote dirty copy exists, local memory 106a has a valid copy and node controller 104a provides the data. If a remote dirty copy exists, node controller 104a issues a write-back request to the current SOC owner of the requested memory location, updates local memory 106a by the returned data and modifies the corresponding OCM 108a entry by resetting the dirty bit to 0.

When remote SOC 100j issues a write request to local SOC 100a for memory location B in EM 106a, node controller 104a ensures that SOC 100j has one and only one copy of memory location B in system 300 to ensure data coherence. Node controller 104a checks if an OCM 108a entry exists. If no OCM 108a entry exists for location B, node controller 104a provides a data copy from local memory EM 106a to the requesting SOC 100j. If an OCM 108a directory entry exists and the dirty bit is not set, it implies clean copies in the shared state may exist in system 300. In this case, an invalidation signal is sent by node controller 104a to those SOCs whose corresponding bit in the vec entry has a value of 1. These SOCs will invalidate their locally cached copy of memory location B and send acknowledgement to local SOC 100a after completion of the invalidation. Local SOC 100a is responsible for collecting all invalidation acknowledgements. After all remote shared copies are invalidated, local SOC controller 104a provides a data copy from the local memory EM 106a to the requesting SOC 100j.

If an OCM 108a entry exists and the dirty bit is set in the entry, it implies a dirty copy exists in system 300. The SOC that currently holds a dirty copy is specified by the bit whose value is 1 in the vector field of the entry. For example, if the n-th bit is 1, the SOC 100n is the current owner and has a dirty copy of the location B. In this case, node controller 104a issues a flush command to SOC 100n. Upon receiving the flush command, SOC 100n sends back its data copy and invalidates its copy. Subsequently, node controller 104a forwards the received data copy from SOC 100n to requesting SOC 100j. In this case, an OCM 108a entry is updated such that only SOC 100j has a copy in the dirty state, that is, the dirty bit is set and only the j-th bit in the vector is set in the corresponding OCM 108a entry. This means SOC 100j has the exclusive copy in system 300.

When a local processor of SOC 100a issues a write request, entries in OCM 108a are checked. If no entry or no remote dirty copy exists, the local memory 106a has a valid copy and node controller 104a provides the required data. If a remote dirty copy exists, node controller 104a issues a flush request to the current owner SOC. If remote shared copies exist, node controller 104a issues invalidations to the remote SOCs who have a copy. SOC 100a now has the exclusive copy and no other SOC in system 300 has a data copy of the accessed memory location B in EM 106a.

Shared Memory Management

FIG. 3B illustrates an example of maintaining memory coherency on a read request in shared memory system 300 according to an embodiment of the invention. As shown in FIG. 3B, NC 104j sends a request to NC 104a to read a memory location A in EM 106a. The request may originate from a processor in SOC 100j, for example processor $P_{R+1}$ 110$_{r+1}$. The request may be sent via a message or signal from node controller 104j to node controller 104a. In response to receiving a request from NC 104j to read memory location A, NC 104a reads memory location A and sends data to NC 104j via bus 302. To maintain memory coherence of the shared data, NC 104a tracks the location of memory requests cached in other SOC units. In the current example, NC 104a stores an entry 304 in OCM 108a. Since SOC 100j requested the data, the $j^{th}$ bit of the vec field in entry 304 is set to 1 to indicate that SOC 100j requested data. In an alternate embodiment, the processor $P_T$ of SOC 100j may be indicated in the vec field as the originator of the request by setting the $T^{th}$ bit of the vec field to 1. In the example shown in FIG. 3B, v is set as 1 to indicate that the entry is valid, d is set as 0 since processor $P_{R+1}$ of SOC 100j did a read request and is not modifying the data obtained from memory location A. The tag field is set as A since data from memory location A was requested. In another embodiment, the address of the memory location stored in the tag field may be abbreviated as a partial address to conserve space in entry 304.

FIG. 3C1 illustrates an example of maintaining memory coherency on an exclusive ownership request in shared memory system 300 according to an embodiment of the invention.

As shown in FIG. 3C1, SOC 100j sends a request for exclusive ownership of data at a memory location B in EM 106a. Exclusive ownership allows SOC 100j to retrieve the data from memory location B and modify it. Therefore the copy at memory location B will become obsolete. The request may originate from a processor in SOC 100j, for example processor $P_T$. The request may be sent by a message from NC 104j to NC 104a via interconnect 302. In response to receiving a request from node controller 104j in SOC 100j for exclusive ownership of memory location B, node controller 104a in SOC 100a sends data from memory location B to node controller 104j via interconnect 302. To maintain coherence, node controller 104a tracks the location of data corresponding to memory location B by storing an entry 306 in OCM 108a.

In the present example shown in FIG. 3C1, v is set as 1 to indicate that the entry is valid, d is set as 1 since exclusive ownership was requested and the copy in memory location B of SOC 100a will not be the latest copy, tag is set as B since data from memory location B was requested. In the above example, since the request originated from SOC 100j, the $j^{th}$ bit of the vec field is set to 1. In an alternate embodiment, the processor $P_T$ of SOC 100j may be indicated in the vec field as the originator of the request by setting the $T^{th}$ bit of the vec field to 1. If a process, thread or processor in SOC 100a wants to access data that was at memory B, the requester recalls the data by requesting it from SOC 100j as shown in FIG. 3C2 and described below.

FIG. 3C2 illustrates retrieving data corresponding to memory location B in EM 106a that was requested for exclusive ownership by NC 104j in SOC 100j in the example above.

In the example shown in FIG. 3C2, processor $P_K$ requests data at memory location B. Node controller 100a looks up entry 306, corresponding to tag B, in OCM 108a. Since, in the previous example shown in FIG. 3C1, exclusive ownership of data at memory location B was requested by processor $P_T$ of SOC 100j, NC 104a sends a request to NC 104j to send data corresponding to memory location B in EM 106a. Node controller 108j accesses the data corresponding to memory location B, for example, from the processor caches (not shown), and sends the data to NC 104a. Since node controller 108a recalled the data from SOC 100j, it again updates entry 306 in OCM 108a as shown in FIG. 3C2.

In the present example shown in FIG. 3C2, v is set as 0 to indicate that the entry is no longer valid in SOC 100j, d is set to 0, if NC 104a requested exclusive ownership. If NC 104a requested data for read only, then v is maintained as 1 to indicate that SOC 100j still has a valid copy. However, d is set to 0 to indicate that SOC 100j no longer has exclusive ownership of the requested data i.e. shared copies of the same data exist in the processor caches in SOC 100a and SOC 100j. Tag is maintained as B.

It is to be appreciated that the numbering of events shown in FIGS. 3B, 3C1 and 3C2 is arbitrary and subject to change based on implementation, as would be recognized by a person of ordinary skill in the art. Interconnect 302 is not reproduced in FIGS. 3B, 3C1 and 3C2 for ease of illustration.

FIG. 3D illustrates an exemplary flowchart 312 showing steps performed by a local SOC upon receiving a request for accessing a local memory location from a remote SOC, in a shared memory system, according to an embodiment of the invention.

In step 314, a request is received from a remote SOC. The request may be received by a local node controller coupled to the remote node controller of the remote SOC. The request may identify the memory location of the local SOC to be accessed along with identifying the remote SOC requesting data. The request may also identify whether the remote SOC wants to read the memory location or have exclusive ownership of the data at a memory location.

In step 316, it is determined whether the local SOC has valid data in the requested memory location. Validity of data is determined by checking an entry, if one exists for the requested memory location, in local on-chip memory. If no entry exists in local on-chip memory for the requested memory location, then valid data in local memory is assumed. If an entry exists, then the local SOC checks if the dirty bit is set. If the dirty bit is set then the local SOC does not have valid data in its local memory.

In step 318, if it is determined in step 316 that the local node does not have valid data in the requested memory location, then the local SOC sends a request to the SOC having the valid data to return the valid data to the local SOC. The local SOC may determine the current SOC having the valid data by examining a vec entry in an on-chip memory as described above.

In step 320, the data received in step 318 is sent to the remote SOC requesting data.

In step 322, if it is determined in step 316 that valid data corresponding to the memory location requested in step 314 is present in local memory, then it is determined from the request received in step 314 whether the remote node has requested exclusive ownership.

In step 324, an entry is stored in the local OCM corresponding to the request by the remote SOC. For example, if the remote SOC requests exclusive ownership an entry is made (as in entry 306 in FIG. 3C1) where the dirty bit is set to 1. If the remote SOC has a read only request then an entry (as in entry 304 in FIG. 3B) is made where the dirty bit is set as 0.

In step 326, the data from the requested memory location is sent to the remote SOC. The data may be sent by the local node controller to the remote node controller via bus 302 as described above.

FIG. 3E illustrates a flowchart showing steps performed by a local SOC and a remote SOC in a shared memory system according to an embodiment of the invention.

In step 332, a remote SOC sends a request to a local SOC for data from a memory location. The request may be received by a local node controller of the local SOC that is coupled to the remote node controller of the remote SOC. The request may identify the memory location of the local SOC to be accessed along with identifying the remote SOC making the request. The request may also identify whether the remote SOC desires to only read the memory location of the local SOC or have exclusive ownership of the memory location. In an embodiment, the local SOC and remote SOC share a global memory address space and the remote SOC uses typical load/store instructions to access a memory location in the local SOC.

In step 334, the local node controller receives the request sent by the remote SOC in step 332. The request may be received and prioritized by the local node controller in the local SOC, according to the order in which the request was received.

In step 336, the local node controller determines whether it has valid data in the memory location for which the request was received in step 334. Validity of data is determined by checking an entry, if one exists for the requested memory location, in local OCM. If an entry exists in the local OCM for the requested memory location and, for example, the dirty bit in the entry is set to 1, then the local SOC does not have valid data in the memory location. If the dirty bit in the entry is set to 0 then the local SOC has valid data in the requested memory location. If no entry exists in local on-chip memory for the requested memory location, then it is assumed that valid data is present in the requested memory location In step 338, if the local node controller determines that the local SOC does not have valid data in the requested memory location, then the local NC, based on a vector field in the entry in a local OCM, requests the data from the SOC having the valid data.

In step 340, the data received by the local SOC from the SOC in step 338 is sent by the local SOC to the remote SOC. The local SOC also updates the local memory with the received data and updates the entry in local OCM to indicate that the local SOC has valid data which is not dirty.

In step 342, the local NC stores an entry in the local OCM corresponding to the request. For example, if the remote SOC requested exclusive ownership then an entry 306 as in FIGS. 3C1 may be made where the dirty bit is set to 1. If the remote SOC made a read only request then an entry 304 as shown in FIG. 3B and described above is made with the dirty bit set at 0.

In step 344, the local NC sends the requested data to the remote NC. The data may be sent via bus 302 as described above.

FIG. 3F illustrates a flowchart showing steps performed by a NC upon receiving a memory access request from a local processor according to an embodiment of the invention. In the example steps presented below, the NC and the processor are on the same SOC. For example, local NC is NC 104 and local processor is one of processors 110.

In step 352, a request for reading data from or writing data to a local memory location is received from a local processor.

In step 354, it is determined whether the local SOC has valid data or exclusive ownership in the local memory location. Validity of data is determined by checking an entry, if one exists for the requested data, in local on-chip memory. In an embodiment, the local node controller checks the local on-chip memory. If an entry exists in the local OCM for the requested memory location and, for example, the dirty bit in the entry is set to 1, then the local SOC does not have valid data in the memory location. If the dirty bit in the entry is set to 0 then the local SOC has valid data in the requested memory location. If no entry exists in local on-chip memory for the requested memory location, then validity of data in local memory is assumed.

In step 356, if it is determined in step 354 that the local SOC does not have valid data in the memory location, then local OCM memory is checked, preferably by the local NC, for an entry corresponding to the memory location specified by the request received in step 352. In an example, as shown in FIG. 3C2 and described above, the vec field of entry 306 is used to determine the remote SOC that has exclusive ownership of the requested memory location.

In step 358, a request is sent to the remote SOC determined in step 356 to send the data.

In step 360, in response to the request sent in step 358, the local SOC receives the data from the remote SOC. The local SOC will update the corresponding entry in the local OCM to indicate that the local SOC has valid data in the requested memory location.

In step 362, the data received from the remote SOC is sent to the processor that requested the data.

In step 364, if it is determined in step 354 that the local SOC does have valid data in the memory location, then the memory location is accessed and data is sent to the processor requesting data. In one example the local NC may access the memory location and in another example, the local NC may use a local memory controller to access the data.

Example embodiments describing a cluster configuration for a node controller and on-chip memory are described below.

Example Cluster System

FIG. 4A illustrates an example cluster system 400. Cluster system 400 is typically a group of n SOC units 100a-n that work together closely so that in many respects they can be viewed as though they are a single SOC. However, each SOC is typically a stand-alone SOC and manages its own resources such as memory. Clusters are commonly, but not always, connected through fast local area networks. Clusters such as cluster system 400 are usually deployed to improve speed and/or reliability over that provided by a single SOC, while typically being much more cost-effective than a single SOC of comparable speed or reliability. In an embodiment, cluster system 400 is a High Performance Cluster (HPC) or a load balancing cluster. It is to be appreciated that the type of cluster system is arbitrary and depends on design requirements.

System 400 includes n SOC units 100a-n interconnected via network 402. In an embodiment, network 402 is a Local Area Network (LAN). The type of network and number of SOC units n is arbitrary. In an embodiment, SOCs 100a-n are connected to network 402 via node controllers 104a-n. In an embodiment of the invention, communication between SOC units 100a-n is via messaging. For example, in a "pull" model embodiment, a process, thread or processor in a source SOC unit sends a signal to a destination SOC unit indicating presence of a message in an allocated memory of the source SOC. The destination SOC, in response to receiving the signal, retrieves or "pulls" the message from the source SOC memory. In a "push" model embodiment, the source SOC transmits or "pushes" a message directly into an allocated memory location of the destination SOC. In an embodiment, the source SOC and destination SOC are part of a Redundant Array of Independent Disks (RAID) system and the message from the source SOC to the destination SOC is a "heartbeat" notification that indicates active operation of the source SOC to the destination SOC. Pull and push model messaging are described in further detail below.

Pull Model Messaging

FIG. 4B illustrates pull model messaging according to an embodiment of the invention. As shown in FIG. 4B, SOC 100j sends a signal to SOC 100a indicating presence of a message in OCM 108j. The message may originate from a processor in SOC 100j, for example from processor $110_{R+1}$ or from a process or thread running on one of the processors $110_R$-$110_T$. The signal may be sent from node controller 104j to node controller 104a via network 402. In an embodiment, the signaling process requires writing a bit into a memory location of SOC 100a to indicate a message in OCM 108j. In response to receiving a signal from node controller 104j indicating presence of a message in OCM 108j, node controller 104a retrieves the message from OCM 108j. In an embodiment, memory locations in OCM 108j are part of a global address space shared by SOC units 100a-100n and node controller 104a accesses the memory location in OCM 108j that has been allocated for messages to SOC 100a. In another embodiment OCM 108j stores messages in a First-In-First-Out (FIFO) queue and NC 104a retrieves the message from the queue in OCM 108j. In yet another embodiment, upon receiving a signal from NC 104j, NC 104a requests NC 104j for the message and NC 104j then sends the message to NC 104a. NC 104a may store the retrieved message in OCM 108a. Messages may be stored in OCM 108a to isolate and protect EM 106a from messages containing viruses. EM 106a may store program code instructions and if a message containing a virus is stored in EM 106a, then the stored program code may be contaminated and adversely effect operation of SOC 100a. By using OCM 108 as a "mailbox" for storing messages to be sent or for receiving message from other SOC units, EM 106 is isolated and protected from virulent messages. Another advantage of the present embodiment is speed of messaging because OCM 108a and OCM 108j are on-chip and are typically fast RAM such as SRAM. Message 404 is an example message format that may be used. Message 404 may include the following fields:

Field "E" indicates an error;

Field "R" indicates a request for an acknowledgement. For example, the source SOC sending the message sets this bit to solicit an acknowledgement from the destination SOC after processing the message;

Field "A" indicates acknowledgement. The destination SOC sets this bit when returning an acknowledgement message to the source SOC that sent the original message;

Field "RSVD" is a reserved field for implementation specific usages;

Field "Status" indicates the outcome of processing the message. For example, a message might request the destination SOC to perform certain operations. The status field indicates whether operation was carried out and any associated information from the performed operation;

Field "INTR" indicates the type of interrupt, if any, that should be generated in the destination SOC and/or the priority of the message;

Field "RID" includes data to uniquely identify a message;

Field "SID" indicates the source SOC unit that generated the message; and

Field "Software Dependent Context" is for message payload. For example, the message payload may include data that is to be processed by the receiving SOC.

It is to be appreciated that the content and fields of a message are arbitrary and may change according to design requirements. In an embodiment, all or part of OCM 108a and 108j may be used as a mailbox for sending or receiving messages. In another embodiment, a specific portion of any memory in SOC 100a or SOC 100j may be used as a mailbox. For example, portions of EM 106a and EM 106j may be allocated as a mailbox in lieu of OCM 108a and 108j respectively. Allocating a specific portion of EM 106 may also allow for isolation of program code from potential viruses in messages.

Push Model Messaging

FIG. 4C illustrates push model messaging according to an embodiment of the invention. In this example, SOC 100*j* sends or "pushes" message 404 into a memory location of SOC 100*a*. The message from SOC 100*j* maybe sent or pushed into a specific location or "mailbox" in OCM 108*a*. The message sent to SOC 100*a* may originate from a processor in SOC 100*j*, for example processor $P_{R+1}$. The message may be sent by node controller 104*j* to node controller 104*a* via network 402. In an embodiment, memory locations in OCM 108*j* are part of a global address space shared by SOC units 100*a*-100*n* and node controller 104*a* accesses the memory location in OCM 108*j* that has been allocated for messages and writes to it. In an embodiment, the memory location in the global address space allocated for messages to SOC 100*a* map to memory locations in OCM 108*a*. Thus, OCM 108*a* is used a "mailbox" by SOC 100*a* to store messages received from other SOC units. In one embodiment, OCM 108*a* stores received messages in a FIFO queue and NC 104*a* retrieves and processes the messages in OCM 108*a* in FIFO order. OCM 108*a* is used as a mailbox to isolate and protect EM 106*a* from viruses or malicious software that may be present in a message. For example, EM 106*a* may store program code instructions and a message containing a virus may adversely effect operation of SOC 100*a*. By using OCM 108*a* as a mailbox for receiving message from other SOC units, EM 106 is isolated and system integrity is protected. One advantage of the present embodiment is the speed of messaging since OCM 108 is typically fast RAM such as SRAM. Another advantage is isolating and protecting system memory from viruses present in received messages. Message 404 has the same fields as described above with reference to FIG. 4B.

FIG. 4D illustrates a flowchart 410 showing steps performed by a local SOC implementing pull model messaging according to an embodiment of the invention. In an embodiment, the steps of flowchart 410 are performed by the local node controller of the local SOC.

In step 412, a signal is received from a remote SOC. The signal indicates presence of a message in the remote SOC. The signal may also indicate the memory location of the message in the remote SOC that contains the message.

In optional step 414, the local SOC requests the message from the remote SOC if it is does not know the memory location in the remote SOC to access or does not have access to the memory location in the remote SOC that contains the message. In an embodiment, the local node controller requests the remote node controller for the message.

In step 416, the local SOC retrieves the message from the remote SOC. In an embodiment, the local node controller of the local SOC retrieves the message from a memory location allocated in an on-chip memory of the remote SOC. The memory location may be part of a global address space used for messaging. Alternately, the local SOC might be pre-programmed with the memory location in the remote SOC that contains the message. If optional step 414 is implemented, then in step 416, the local node controller receives the message from the remote SOC instead of retrieving it.

In step 418, the local SOC stores the retrieved message. In an embodiment, the local node controller stores the message in local on-chip memory.

FIG. 4E illustrates a flowchart 420 showing steps performed by a remote SOC implementing pull model messaging according to an embodiment of the invention. In an embodiment, the steps of flowchart 420 are performed by the remote node controller.

In step 422, the remote SOC sends a signal indicating presence of a message in its on-chip memory. The signal may indicate the memory location containing the message.

In optional step 424, the remote SOC receives a request from a local SOC for the message.

In step 426, if in step 424 the remote SOC received a request from a local SOC for the message, the remote SOC sends the message to the local SOC. Alternatively, the remote SOC allows the local SOC access to the remote on-chip memory location containing the message.

FIG. 4F illustrates a flowchart 430 showing steps performed by a remote SOC implementing push model messaging according to an embodiment of the invention. In an embodiment, the steps of flowchart 430 are performed by the remote node controller.

In step 432, the memory location in a local SOC where a message is to be written is determined. The memory location in the local SOC that is to be used may be pre-programmed into the remote SOC or the local SOC may have previously indicated the memory location to be used for messaging. Alternatively, the memory location to be written in the local SOC may be part of a global address space used for messaging.

In step 434, the remote SOC writes the message to the memory location determined in step 432. Alternatively, the remote node controller in the remote SOC sends the message to the local node controller in the local SOC.

Example embodiments describing a memory lock configuration for a node controller and on-chip memory are described below.

Memory Locks

A memory lock is a synchronization mechanism for enforcing limits on access to a memory location in an environment where multiple "requesters" (such as SOC units, threads, processes and/or processors) attempt to access the same memory location at proximately the same time. Locks are one way of enforcing concurrency control policies. Typically, requesters cooperate with each other by using an arbitration protocol that involves passing messages amongst requesters to decide which requester acquires the lock to access the memory location. However, when multiple requesters attempt to access the same memory location concurrently, typical methods of arbitration can be time consuming and increase system overhead. Embodiments of the invention described below overcome this deficiency by using node controller 104 in conjunction with OCM 108 to implement memory locks. The memory locks can be implemented in a stand alone SOC 100, shared memory systems such as system 300 or a cluster configuration as in system 400.

FIG. 5A illustrates example association between memory locations and memory locks according to an embodiment of the invention. In the example shown in FIG. 5A, OCM 108 stores lock entries (described below) for corresponding memory locations in EM 106. For example, a memory location Y in OCM 108 stores a lock entry corresponding to a memory location X in EM 106. If a requester requests access to modify memory location X, NC 104 checks the lock stored in memory location Y to determine whether to grant access to the requester. According to an embodiment, node controller 104, receives the request from the requester for access to write to memory location X, checks the lock entry in memory location Y of OCM 108 and determines whether to grant access to the requester. NC 104 may determine which memory location in OCM 108 has a lock for a memory location in EM 106 by using a table of associations between memory locations in EM 106 and corresponding memory locations storing locks in OCM 108. The locks stored in OCM 108 allow for two modes of operation. In one mode of operation, "test-and-set" locks are used and in another mode, "sequencer" locks are used.

Test-and-set locks are used to atomically write to a memory location. Test-and-set locks involve setting a value in a lock entry to acquire a lock, but first performing some test (such as, testing the current set value in a lock as being equal to 0 or 1). If the test fails, the lock cannot be acquired or set and hence the memory location corresponding to the lock cannot be accessed by the requester. The requester has to again "test" the lock in the future to determine whether it can be acquired. Example embodiments using test-and-set mode are described below.

In sequencer mode, a ticket is assigned to each requester in the order in which a requester requests access to write a memory location. The lock entry corresponding to the requested memory location stores the current ticket and the next ticket. In the sequencer mode, the requester with the current ticket number acquires a lock and gains access to the corresponding memory location. While a memory location is occupied by a current ticket holder, the sequencer provides unique next tickets to subsequent requesters. The next ticket numbers are typically issued in sequential order thereby forming a virtual First-In-First-Out (FIFO) queue of requesters. When a current ticket holder accessing the memory location releases the lock, the current ticket +1 becomes the subsequent current ticket value. The requester with the subsequent current ticket value can now acquire the lock and gain access to modify the memory location.

Using node controller 104 to control access to memory locations in EM 106 removes the arbitration load from processors 110 and substantially eliminates bus traffic due to arbitration. Since OCM 108 is on-chip, accessing OCM 108 to look up a lock and determine whether to grant access to a corresponding memory location is fast and efficient.

Lock Entries

FIG. 5B illustrates an example lock entry that is stored in a memory location in OCM 108. Lock entry 500 is an example format and the fields and size of the fields may vary according to implementation. Lock entry 500 includes the following fields:

Field "Mode" indicates the mode of operation to be used. For example, if mode is set as 0, then "test-and-set" lock mode is used. If mode is set as 1, the "sequencer" lock mode is used. The test-and-set lock mode and sequencer lock mode are further described below;

Field "S" or "Set" is applicable only when the field mode is in test-and-set lock mode. When S is 0, the lock is free. If a requester attempts to access a memory location and the corresponding lock entry's S bit indicates that it is free, then S is set to 1 and the requester is granted access. Setting the S bit to 1 is functionally equivalent to acquiring the lock. After the lock is acquired, the corresponding memory location can be accessed. Accessing a free lock entry returns the current value of 0 and the Software Dependent Context field (described below) as they were last saved. After the lock has been acquired, the Owner Identification (OID) field (described below) is set to indicate the requester that acquired the lock;

If, upon accessing a lock, a S value of 1 is returned to the requester by the NC, then the requester indicated by the OID field currently has the lock. Accordingly, the memory location corresponding to the lock cannot be accessed. The requester has to try again to acquire the lock;

Field "R" or "Recovery" bit is typically set during recovery operations. When the R bit is set as 0, the lock can be accessed normally. During recovery, when the R bit is set to 1, locks that are currently owned by inoperative or "dead" requesters are re-claimed. For example, a processor that acquires a lock might malfunction and become inoperative before it can release an acquired lock. When the R bit is set to 1, the lock is to be reset for recovery. With the R bit set to 1, recovery software can force release of a lock and re-initialize the corresponding memory location that the lock protects. During recovery, with the R bit set to 1 by a requester initiating the recovery process, the semantics of other fields are overruled. The OID is set to the ID of the requester selected to perform recovery. After a lock has been recovered, it can function normally;

Field "Next Ticket" stores a value that is utilized only in sequencer lock mode. Upon receiving a request to access a memory location, for example in EM 106, NC 104 looks up the lock corresponding to the requested memory location in OCM 108. If the lock is occupied, then NC 104 returns the current value in the Next Ticket field of the lock to the requester. NC 104 then increments the value in the Next Ticket field by one and returns that value to a subsequent requester when the lock is occupied. Thus, requesters waiting to access a memory location effectively insert themselves in a queue with an order of access defined by the assigned ticket number. If the lock is free when a requester requests access, then the current ticket value equals the next ticket value and the requester is assigned the current ticket value and granted access to the corresponding memory location. In an embodiment, Next Ticket is a 6-bit unsigned number. In another embodiment, the Next Ticket value may be a random alphanumeric code generated by NC 104. The node controller will then keep track of the sequence in which alphanumeric codes were generated and grant access in that order;

Field "Current Ticket" stores a value that is utilized only in sequencer lock mode. A requester having the current ticket number is allowed to acquire the lock and access the corresponding memory location. To release the lock, the requester stores a new value that is equivalent to the current ticket +1 in the Current Ticket field of the lock. This effectively allows the requester that is next-in-line to acquire the lock and access the memory location; and Field "Software Dependent Context" is a 96-bit field that can be read from or written to by a requester that has acquired the corresponding lock. The context field may contain pointers to structures being protected by the lock. When a requester acquires a lock, it also gets a pointer to the memory location corresponding to the lock in, for example, external memory. System recovery often requires rebuilding or relocating data tables. The context field can be used to avoid significant performance problems with distributed table management.

Processes may also use the context field to implement efficient hardware mailboxes as described above. For exchanging data that does not exhibit temporal locality, the use of protected hardware mailboxes avoids cache coherence overhead.

Test-and-Set Mode

FIGS. 5C1-5C3 illustrate example operation of memory locks in test-and-set mode according to an embodiment of the invention. In the examples presented in FIGS. 5C1-5C3, the mode bit is set as 0 (for test-and-set mode) and the next ticket and current ticket fields are not applicable (NA), since the lock is in test-and-set mode. The R bit is 0 indicating that the lock is not in recovery mode. In this example of the test-and-set mode, a value of S=0 indicates the lock is free and S=1 indicates that the lock is acquired.

As shown in FIG. 5C1, NC 104 receives a request from a requester R1 for access to modify a memory location X in EM 106. In response to receiving the request, NC 104 checks a lock entry 500*a* stored in memory location Y of OCM 108 that corresponds to memory location X. In lock entry 500*a*, S is 0 indicating that the lock can be acquired and the corresponding memory location can be accessed. Accordingly, NC 104 grants access to requester R1 to modify memory location X. Subsequently, either NC 104 or requester R1 modifies lock entry 500*a* to lock entry 500*b*. In lock entry 500*b*, S is set to 1 and OID is set to R1 to indicate the requester R1 has acquired the lock in memory location Y.

In FIG. 5C2, NC 104 receives a request from requester R2 for access to modify memory location X in EM 106. In response to receiving the request, NC 104, checks the lock entry 500*b* stored in memory location Y corresponding to memory location X. In lock entry 500*b*, S is 1 and OID is R1 indicating that the lock is currently owned by requester R1. Thus, the corresponding memory location X cannot be modified by requester R2. Accordingly, NC 104 rejects the request from requester R2 to modify memory location X. Requester R2 will have to try again to gain access to modify memory location X.

In FIG. 5C3, requester R1 releases memory location X. NC 104 sets S as 0 thereby changing lock entry 500*b* to lock entry 500*c*. Since the lock is released, memory location X in EM 106 is again available for modification. Upon again receiving a request from requester R2 to modify memory location X, NC 104 checks lock entry 500*c*. In lock entry 500*c*, since S is 0, the lock can be acquired. Accordingly, NC 104 grants access to requester R2 to modify memory location X. Either NC 104 or requester R2 modifies lock entry 500*c* to lock entry 500*d* by setting S to 1 and OID to R2. Lock entry 500*d* now indicates that the lock in memory location Y of OCM 108 is acquired and requester R2 has current rights to modify memory location X in EM 106.

FIG. 5C4 illustrates a flowchart 510 showing steps performed by a node controller in test-and-set mode, according to an embodiment of the invention.

In step 512, a request to modify a first memory location is received. In an example, a node controller receives the request from a requester that may be a SOC, a processor, a thread or process.

In step 514, an entry in a second memory location corresponding to the first memory location is checked to determine whether the first memory location is available for modification. In an example, a node controller looks up a table for the second memory location corresponding to the first memory location. The second memory location may be in an on chip memory. The data in the second memory location may be a lock entry with a field that indicates whether the first memory location is available for modification.

In step 516, if it is determined in step 514 that the first memory location is not available for modification then the requester is denied access to modify the first memory location. The first memory location is indicated as being locked.

In step 518, if it is determined in step 514 that the first memory location is available for modification then the requester is granted access to modify the first memory location. If there were multiple requesters in step 512 for the first memory location, then the node controller grants access to the first requester to modify the first memory location.

In step 520, the entry in the second memory location is modified to indicate that the first memory location is locked. The ID of the requester that has current access to modify the first memory location is also stored.

In optional step 522, if there were multiple requesters in step 512, then the remaining requesters are denied access to modify the first memory location.

Sequencer Mode

FIGS. 5D1-5D3 illustrate example operation of memory locks in sequencer mode according to an embodiment of the invention. In the examples presented in FIGS. 5D1-5D3, the "Mode" field is set as 1 and the set field "S" is not applicable (NA), since test-and-set lock mode is not in use. The R bit is set as 0 to indicate that the lock is not in recovery mode.

In FIG. 5D1, NC 104 receives a request from a requester R1 to modify a memory location X in EM 106. The example shown in FIG. 5D1 is an initial startup condition where R1 is the first requester to request access to modify memory location X and there are no prior requesters. Due to initial conditions, when NC 104 checks lock 500*e* in memory location Y of OCM 108, the current ticket, next ticket and OID fields are Not Applicable (NA). In response to receiving the request, NC 104 grants access to requester R1 to modify memory location X and assigns R1 current ticket value of, for example, "A". NC 104 or requester R1 updates lock entry 500*e* to lock entry 500*f* that indicates the current ticket as A, next ticket as A+1 and OID as R1 to indicate that requester R1 has current ownership of the lock in memory location Y of OCM 108 and rights to modify memory location X in EM 106.

In FIG. 5D2, NC 104 receives a request from requester R2 to modify memory location X in EM 106. In response to receiving the request, NC 104, checks the lock entry 500*f* stored in memory location Y corresponding to memory location X. In lock entry 500*f*, current ticket is A, and OID is R1 indicating that the lock is currently owned by requester R1. NC 104 denies access to requester R2 and grants R2 the next ticket value of A+1. When requester R1 with ticket A releases the lock, requester R2 with ticket A+1 will be granted access to modify memory location X. NC 104 or requester R2 changes lock entry 500*f* to lock entry 500*g* to indicate the next ticket as A+2. The next requester after R2 will be granted ticket A+2. Thus a queue of requesters is maintained while memory location X is unavailable for modification.

In FIG. 5D3, requester R1 releases memory location X. Since R2 is in next in the queue and has ticket A+1, R2 is granted access to memory location X. Lock entry 500*g* is updated to entry 500*h* that indicates the current ticket as A+1 and OID as R2, the current owner of the lock. If requester R2 does not take ownership of the memory location X, for example, because it no longer needs to modify memory location X or if R2 malfunctions, then ownership is granted to the next requester in queue.

It is to be appreciated that in the event that a requester fails to release a memory lock, the lock can be re-acquired by setting R as 1 and initiating recovery mode.

FIG. 5D4 illustrates a flowchart 530 showing steps performed by a node controller in sequencer mode, according to an embodiment of the invention.

In step 532, a request to modify a first memory location in a first memory is received. In an example, a node controller receives the request from a requester that may be a SOC, a processor, a thread or a process. The first memory may be a RAM memory external to the SOC. The node controller may receive multiple requests from multiple requesters for access to modify the first memory location.

In step 534, an entry in a second memory location corresponding to the first memory location is checked to determine whether the first memory location is available for modification. In an example, to determine the corresponding second memory location, a node controller looks up a table that includes the second memory location corresponding to the first memory location. The second memory location may be in a second memory such as, for example, on chip memory. Alternatively, the second memory location may be in the first memory. The data in the second memory location may be a lock entry as described above. The data in the lock entry, such as the OID field of the lock entry may indicate whether there is a current owner of the first memory location. Alternatively, the current ticket and next ticket field may indicate that there are requesters in queue ahead of the current requester from step 532.

In step 536, if it is determined in step 534 that the first memory location is not available for modification then, the requester from step 532 is assigned a ticket number. The requester is thereby inserted in a queue and will access the first memory location according to order of the assigned ticket number.

In step 538, the entry in the second memory location corresponding to the first memory location is updated to change the next ticket number.

In step 540, if it is determined in step 536 that the first memory location is available for modification then, the requester from step 532 is granted access to the memory location. The requester from step 532 is also assigned a current ticket value from a current ticket field in the lock. The requester may use the current ticket value to release the lock on the first memory location after it has completed modification of the first memory location.

In step 542, the entry in the second memory location is updated to reflect the requester from step 532 as the current owner of the lock and the current ticket holder.

FIG. 5D5 illustrates a flowchart 550 showing steps performed by a requester requesting access to modify a memory location, according to an embodiment of the invention.

In step 552, a request to modify a memory location is sent. The request may be sent to a remote node controller controlling access to the memory location. In an example, the requester may be a SOC, a processor, a thread or a process.

In step 554, it is determined whether access is received to modify the memory location.

In step 556, if access was denied to modify the memory location in step 554, then a ticket is received. The ticket may be received from the node controller. The ticket may indicate the position of the requester in a queue to access the memory location. The requester waits in queue for its turn to modify the memory location.

In step 558, the requester receives access according to the ticket number received in step 556. The requester can now modify the memory location.

In step 560, the requester releases the lock thereby allowing the next requester in queue to access the memory location. In an example, the requester transmits its ticket number to the node controller which in turn releases the lock and grants access to the next requester in queue.

In step 562, if access is received to modify the memory location in step 554, then the requester modifies the memory location. The requester then releases the lock in step 560 as described above.

In the sequencer mode of operation, if a controller receives multiple requests to modify the same memory location, where the requests are closely spaced in time, the sequencer orders the requests in order of arrival and then assigns tickets in that order. In an alternate embodiment, the controller assigns tickets in order of a priority level of a request. The priority level may be a positive number sent by the requester along with the request. Higher priority numbers may indicate higher priority. In yet another embodiment, requesters are ordered using a combination of arrival time and priority level. For example, if arrival times and priority levels are each assigned a numeric weight, then a linear combination of numeric weights may be used to order requesters and assign tickets.

Software Embodiments for Test-and-Set and Sequencer Modes

In an embodiment, node controller 104 is under the control of software. In this embodiment, node controller 104 only supports mutual exclusion of a memory location. It is up to the software for associating a lock to a memory location that needs to be protected. The software knows that the hardware exports n memory locations that can act as locks. The software then allocates and associates a particular lock for data objects to be protected. In this embodiment, node controller 104 simply performs the needed operations for supporting the semantics of test-and-Set or sequencer lock modes. This simplifies the hardware for node controller 104. The hardware does not need to do the bookkeeping for the association between a lock and the memory location being protected by the lock.

With reference to FIG. 5A, in a test-and-set mode, example software pseudo-code for enabling a requester R to access memory location X with a corresponding lock stored in memory location Y is shown below:

```
while (Test-and-Set(lock) == 1) ;
    access and modify memory location X;
Unlock(lock).
```

In the above pseudo-code, the Test-and-Set command causes node controller 104 to return the present value of the Set field in the entry stored in memory location Y of OCM 108. The code loops until the lock is free i.e. the value returned by node controller 104 is 0 indicating the lock is free for requester R to acquire. The Test-and-Set command also causes node controller 104 to change the Set field of the lock in memory location Y back to 1. Change of the Owner Identification field to indicate requester R as the current owner is done only if the present value in the Set field is 0. Requester R accesses and modifies memory location X. The Unlock command changes the Set field back to 0 to allow another requester to access memory location X.

With reference to FIG. 5A, in a sequencer mode, example software pseudo-code for enabling a requester R to access memory location X with a corresponding lock stored in memory location Y is shown below:

```
ticket = Get_Ticket( );
while (ticket != Read_Current_Ticket ( ));
    access and modify memory location X;
Increment_Ticket( );
```

In the example pseudo-code above, the Get_Ticket( ) command causes node controller 104 to return a next ticket number from an entry in memory location Y of OCM 108. The ticket is assigned to requester R and stored in the variable "ticket". The Read_Current_Ticket( ) command causes node controller 104 to return the current ticket value stored in memory location Y in OCM 108. Requester R keeps checking the current ticket value stored in memory location Y until the current ticket value in memory location Y equals the ticket value assigned to requester R. After gaining access to memory location X and modifying it, requester R issues an Increment_Ticket( ) command to increment the current ticket field in memory location X and allow the next requester in line to acquire the lock in memory location Y and access memory X.

In the embodiments shown in FIGS. 5, OCM 108 may store lock entries for corresponding memory locations in EM 106. In another embodiment, OCM 108 stores lock entries for memory locations including but not limited to EM 106, such as caches, disk drives etc. In yet another embodiment, memory modules other than OCM 108 store memory locks. For example, a portion of EM 106 may be allocated to store memory locks for memory locations in a remaining portion of EM 106.

Example Computer System Embodiments

In this document, the terms "computer program medium" and "computer usable medium" are used to generally refer to media such as a removable storage unit, a hard disk installed in hard disk drive, and signals (i.e., electronic, electromagnetic, optical, or other types of signals capable of being received by a communications interface). These computer program products are means for providing software to a computer system. The invention, in an embodiment, is directed to such computer program products.

In an embodiment where aspects of the present invention are implemented using software, the software may be stored in a computer program product and loaded into a computer system (e.g., a reader or host) using a removable storage drive, hard drive, or communications interface. The control logic (software), when executed by a processor, causes the processor to perform the functions of the invention as described herein. Still further, a sensor may execute computer readable instructions to collect data. Still further, a near field transceiver may execute computer readable instructions to communicate with sensors and/or tags.

According to an example embodiment, a reader may execute computer-readable instructions to read tags, as described above. Furthermore, in an embodiment, a tag may execute computer-readable instructions to respond to a reader transmitted signal, as further described elsewhere herein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system to implement hardware memory locks, comprising:
    a System-On-a-Chip (SOC) unit, including:
    a controller; and
    on-chip memory;
    off-chip memory coupled to the SOC;
    wherein upon receiving a request from a requester to access a first memory location in the off-chip memory, the controller grants or denies access to modify the first memory location based on an entry stored in a second memory location of the on-chip memory.

2. The system of claim 1, wherein the on-chip memory is Static Random Access Memory (SRAM) and the off chip memory is Random Access Memory (RAM).

3. The system of claim 1, wherein the controller grants access to modify the first memory location if a bit in the second memory location is a first value and deny access to modify the first memory location if the bit is a second value.

4. The system of claim 1, wherein the controller grants access if the requester has a ticket value equal to a current ticket value stored in the entry.

5. The system of claim 4, wherein the controller increments the current ticket value after a requester releases the first memory location.

6. The system of claim 1, wherein the controller assigns a next ticket value and denies access to a requester if the first memory location is unavailable for modification based on the entry in the second memory location.

7. The system of claim 6, wherein the controller increments the next ticket value in the entry upon assigning the next ticket value to the requester.

8. The system of claim 1, wherein in response to receiving a plurality of requests to modify the first memory location, the controller is enabled to sort the requests based on at least one of time of arrival and level of priority.

9. The system of claim 8, wherein the controller assigns tickets to requesters based on the sorted order of requests.

10. A method to implement a hardware memory lock, comprising:
    receiving a request from a requester to modify a first memory location in an off-chip memory; and
    granting or denying access to modify the first memory location based on an entry stored in a second memory location of an on-chip memory.

11. The method of claim 10, further comprising, upon denying access to the requester, assigning a ticket value from a next ticket field in the second memory location to the requester.

12. The method of claim 10, wherein the next ticket value, relative to a current ticket value in a current ticket field of the second memory location, indicates a position of the requester in a virtual First-In-First Out (FIFO) queue to access the first memory location.

13. The method of claim 10, further comprising, upon receiving multiple requests to modify the first memory location, assigning ticket values based on priority of request and time of arrival of the request.

14. The method of claim 10, further comprising updating an owner identification field in the entry to indicate whether the first memory location is available for modification.

15. The method of claim 10, further comprising updating a current ticket field in the second memory location to indicate the ticket value of a requester to be granted access to the first memory location.

16. A method to grant access to modify a memory location, comprising:
    receiving a request from a first requester to modify a first memory location in an off-chip memory;
    granting access to the first requester to modify the first memory location, if a specific bit in an entry stored in a second memory location of an on-chip memory is a first value; and
    setting the bit to a second value so as to indicate that the first memory location is unavailable for modification to a subsequent requester.

17. The method of claim 16, further comprising setting the bit back to the first value to indicate the first memory location is available for modification.

18. The method of claim 16, further comprising denying a request to modify the first memory location if the bit is set to the second value.

19. The system of claim 16, wherein the on-chip memory is Static Random Access Memory (SRAM) and the off-chip memory is Random Access Memory (RAM).

20. The method of claim 16, wherein the entry includes a field to indicate a current requester that has access to modify the first memory location.

* * * * *